(12) United States Patent
Lee et al.

(10) Patent No.: US 10,050,114 B2
(45) Date of Patent: Aug. 14, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Bok-Young Lee, Seoul (KR); Sung-Woo Kang, Suwon-si (KR); Sang-Hyun Lee, Hwaseong-si (KR); Hak-Yoon Ahn, Seoul (KR); Young-Mook Oh, Hwaseong-si (KR); In-Keun Lee, Anyang-si (KR); Seong-Han Oh, Namyangju-si (KR); Young-Hun Choi, Incheon (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/652,396

(22) Filed: Jul. 18, 2017

(65) Prior Publication Data
US 2018/0190780 A1 Jul. 5, 2018

(30) Foreign Application Priority Data
Jan. 2, 2017 (KR) .................. 10-2017-0000057

(51) Int. Cl.
*H01L 29/417* (2006.01)
*H01L 29/78* (2006.01)
(Continued)

(52) U.S. Cl.
CPC .............. *H01L 29/41791* (2013.01); *H01L 21/823431* (2013.01); *H01L 21/823475* (2013.01); *H01L 23/535* (2013.01); *H01L 27/088* (2013.01); *H01L 29/0847* (2013.01); *H01L 29/45* (2013.01); *H01L 29/7851* (2013.01);
(Continued)

(58) Field of Classification Search
CPC ....... H01L 29/41791; H01L 21/823475; H01L 29/7851; H01L 27/088; H01L 23/535; H01L 29/0847; H01L 21/823431; H01L 29/45; H01L 29/66545; H01L 29/7848; H01L 29/66636
See application file for complete search history.

(56) References Cited

U.S. PATENT DOCUMENTS 6,223,432 B1 5/2001 Dennison et al.
6,287,951 B1 9/2001 Lucas et al.
(Continued)

*Primary Examiner* — David Vu
(74) *Attorney, Agent, or Firm* — Lee & Morse, P.C.

(57) ABSTRACT

A semiconductor device includes an active region in a shape of a fin extending in a first direction, the fin having source/drain regions spaced apart therein, gate structures crossing the fin between the source/drain regions, each including a gate electrode, a first contact structure in electrical contact with a first source/drain region, the first contact structure including a first lower contact and a first upper contact directly thereon, a second contact structure in electrical contact with a gate electrode of a gate structure, the second contact structure including a second lower contact and a second upper contact directly thereon, and a third contact structure in electrical contact with a gate electrode of a second gate structure and in electrical contact with a second source drain region, the third contact structure including a third lower contact and a third upper contact directly thereon.

20 Claims, 25 Drawing Sheets

(51) Int. Cl.
*H01L 29/08* (2006.01)
*H01L 29/45* (2006.01)
*H01L 21/8234* (2006.01)
*H01L 23/535* (2006.01)
*H01L 27/088* (2006.01)
*H01L 29/66* (2006.01)

(52) U.S. Cl.
CPC .. *H01L 29/66545* (2013.01); *H01L 29/66636* (2013.01); *H01L 29/7848* (2013.01)

(56) References Cited

U.S. PATENT DOCUMENTS

| | | |
|---|---|---|
| 6,724,085 B2 | 4/2004 | Tomita |
| 8,426,310 B2 | 4/2013 | Adetutu et al. |
| 8,895,389 B2 | 11/2014 | Hong |
| 8,906,793 B2 * | 12/2014 | Kanakasabapathy H01L 21/28008 257/410 |
| 9,105,614 B2 | 8/2015 | Sardesai |
| 2007/0096212 A1 | 5/2007 | Sato et al. |
| 2016/0268415 A1 | 9/2016 | Labonte et al. |
| 2016/0276213 A1 | 9/2016 | Li et al. |
| 2016/0284712 A1 | 9/2016 | Liaw |
| 2016/0284799 A1 | 9/2016 | Yoon et al. |

* cited by examiner

SEMICONDUCTOR DEVICE AND METHOD OF MANUFACTURING THE SAME

CROSS-REFERENCE TO RELATED APPLICATION

Korean Patent Application No. 10-2017-0000057, filed on Jan. 2, 2017, in the Korean Intellectual Property Office, and entitled: "Semiconductor Device and Method of Manufacturing the Same," is incorporated by reference herein in its entirety.

BACKGROUND

1. Field

Embodiments relate to a semiconductor device and a method of manufacturing the same.

2. Description of the Related Art

A semiconductor device may include a transistor. The transistor may include contact structures contacting a gate and/or impurity regions of the transistor.

A type of the transistor is a metal-oxide-semiconductor field effect transistor (MOSFET). In a MOSFET, a gate structure may be energized to create an electric field in an underlying channel region of a substrate, by which charge carriers are allowed to travel between a source region and a drain region.

SUMMARY

Embodiments are directed to a semiconductor device, including a substrate, an active fin protruding from the substrate, the active fin extending in a first direction, gate structures on the active fin, each of the gate structures including a gate insulating layer, a gate electrode, and a capping pattern that are sequentially stacked, and extending in a second direction crossing the first direction, a first contact structure including a first lower contact and a first upper contact, the first lower contact contacting a surface of a first source/drain in the active fin between the gate structures, the first upper contact contacting an upper surface of the first lower contact, a second contact structure including a second lower contact and a second upper contact, the second lower contact penetrating the capping pattern of a first one of the gate structures to contact an upper surface of the gate electrode of the first one of the gate structures, the second upper contact contacting an upper surface of the second lower contact, and a third contact structure including a third lower contact and a third upper contact, the third lower contact penetrating the capping pattern of a second one of the gate structures to contact an upper surface of the gate electrode of the second one of the gate structures, and contacting a surface of a second source/drain in the active fin adjacent to one sidewall of the second one of the gate structures, the third upper contact contacting an upper surface of the third lower contact.

Embodiments are also directed to a semiconductor device, including a substrate, an active fin protruding from the substrate, the active fin extending in a first direction, gate structures on the active fin, each of the gate structures including a gate insulating layer, a gate electrode, and a capping pattern that are stacked, and extending in a second direction crossing the first direction, epitaxial structures in the active fin between the gate structures, a first contact structure including a first lower contact and a first upper contact, the first lower contact contacting a surface of a first one of the epitaxial structures, the first upper contact contacting an upper surface of the first lower contact, a second contact structure including a second lower contact and a second upper contact, the second lower contact penetrating the capping pattern of a first one of the gate structures to contact an upper surface of the gate electrode of the first one of the gate structures, the second upper contact contacting an upper surface of the second lower contact, and a third contact structure including a third lower contact and a third upper contact, the third lower contact penetrating the capping pattern of a second one of the gate structures to contact an upper surface of the gate electrode of the second one of the gate structures, and contacting a surface of a second one of the epitaxial structures adjacent to one sidewall of the second one of the gate structures, the third upper contact contacting an upper surface of the third lower contact.

Embodiments are also directed to a semiconductor device, including a substrate having an active region in the shape of a fin that extends in a first direction, the fin having a plurality of source/drain regions spaced apart therein, gate structures crossing the fin in regions between the source/drain regions, each of the gate structures including a gate electrode, a first contact structure in electrical contact with a first one of the source/drain regions, the first contact structure including a first lower contact and a first upper contact directly on the first lower contact, a second contact structure in electrical contact with a gate electrode of a first one of the gate structures, the second contact structure including a second lower contact and a second upper contact directly on the second lower contact, and a third contact structure in electrical contact with a gate electrode of a second one of the gate structures and in electrical contact with a second one of the source drain regions, the third contact structure including a third lower contact and a third upper contact directly on the third lower contact.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
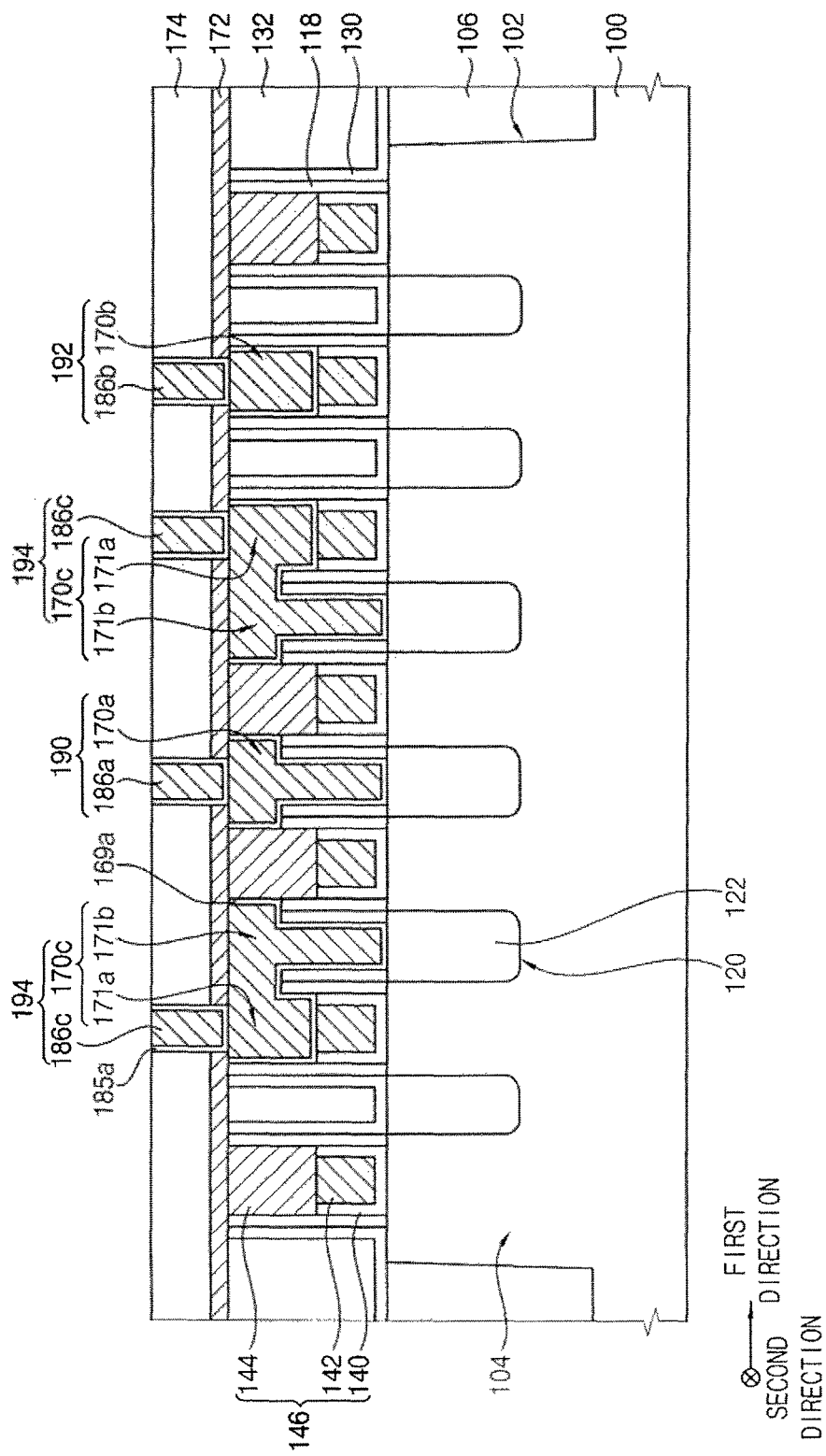
FIG. 1 illustrates a cross-sectional view of a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Figure 2A:
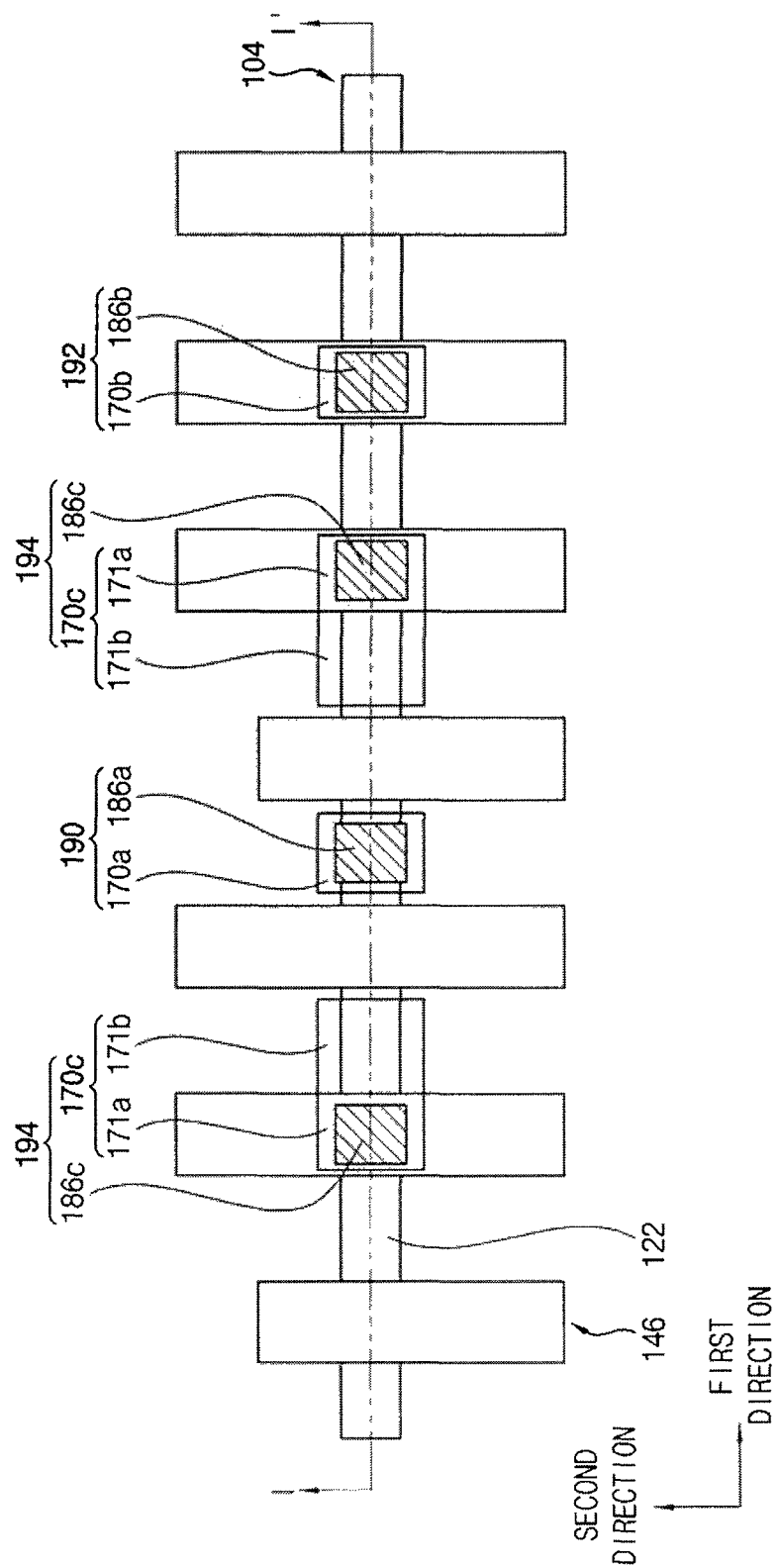
FIG. 2A illustrates a plan view of a semiconductor device according to example embodiments.
Figure 2B:
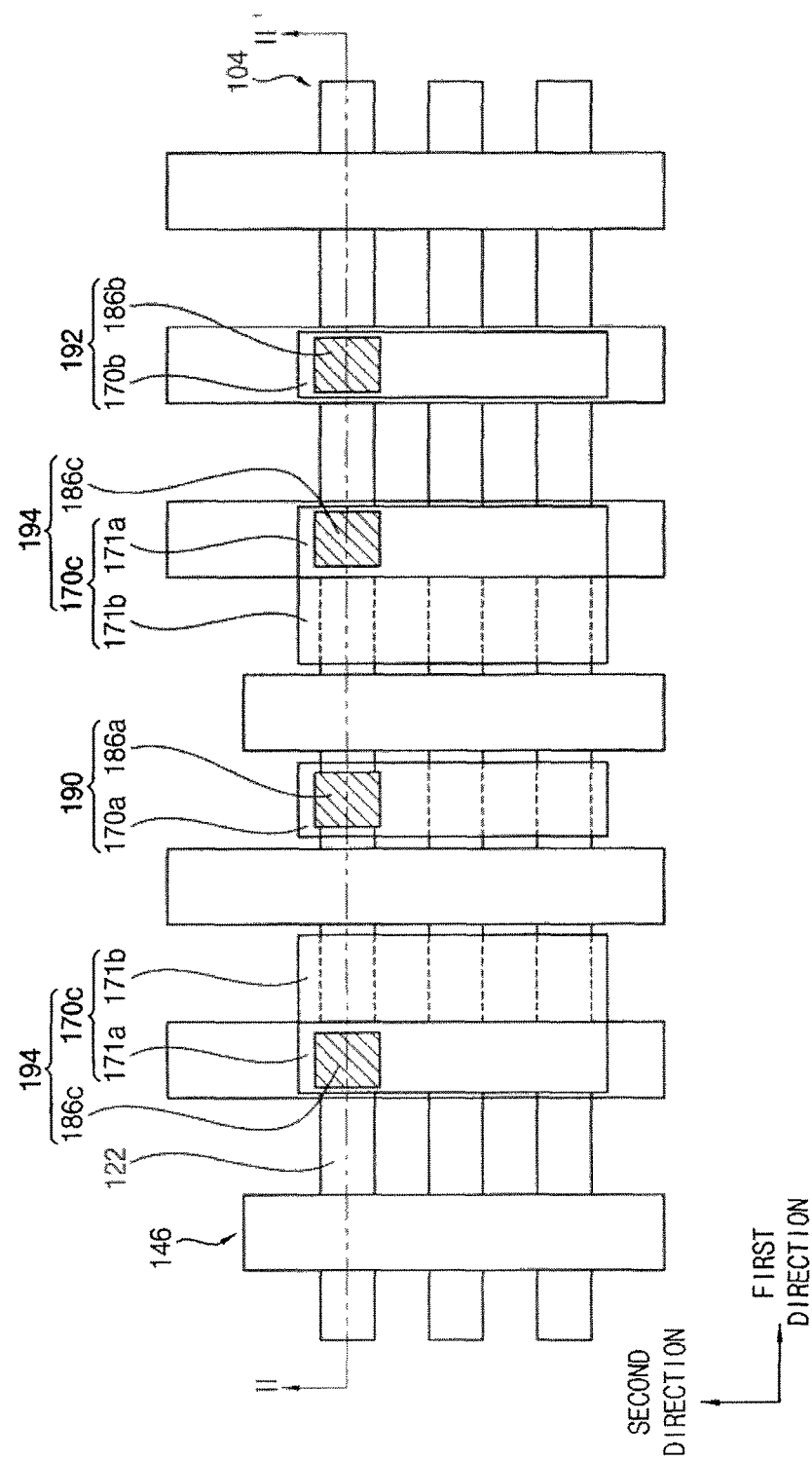
FIG. 2B illustrates a plan view of a semiconductor device according to example embodiments.

FIG. 1 is a cross-sectional view of a semiconductor device according to example embodiments. FIG. 2A is a plan view of a semiconductor device according to example embodiments. FIG. 2B is a plan view of a semiconductor device according to example embodiments.

FIG. 1 illustrates a cross-sectional view taken along line I-I' of FIG. 2A or FIG. 2B. In FIGS. 2A and 2B, some elements may be omitted for clarity. For example, in FIGS. 2A and 2B, a spacer and an interlayer insulating layer are not illustrated. Elements shown in FIG. 2A may be substantially the same as those shown in FIG. 2B except for the number of active fins and a plan shape of the contact structures Referring to FIGS. 1, 2A and 2B, the semiconductor device may include an active fin 104 protruding from a substrate 100, gate structures 146 on the active fin 104, a first contact structure 190, a second contact structure 192 and a third contact structure 194. The semiconductor device may further include an isolation layer 106, a spacer 118, a liner 130, an epitaxial structure 122, and first and second interlayer insulating layers 132 and 174.

The substrate 100 may include silicon. In some embodiments, the substrate 100 may include a silicon on insulator (SOI) substrate or a germanium on insulator (GOI) substrate. The substrate 100 may have crystallinity, e.g., the substrate 100 may be a single crystalline substrate or have monocrystallinity, The active fin 104 may include a first pattern extending in a first direction and a second pattern protruding from the first pattern above the substrate 100. The active fin 104 may be formed by etching a portion of the substrate 100, and thus may include the same material as the substrate 100. As an example, as shown in FIG. 2B, the active fin 104 may include a plurality of active fins arranged in a second direction crossing or perpendicular to the first direction. A recess 120 may be formed in the active fin 104. The recess 120 may include a plurality of recesses arranged in the first direction.

The isolation layer 106 may include, for example, an oxide such as silicon oxide.

The gate structures 146 may cross the active fin 104. The gate structures 146 may cover a surface (e.g., a top surface and sidewalls) of the active fin 104 and may extend in the second direction. The gate structures 146 on the active fin 104 may include a plurality of gate structures arranged to be spaced apart on the active fin 104 in the first direction.

The gate structures 146 may each include, for example, a gate insulating layer 140, a gate electrode 142, and a capping pattern 144 that are sequentially stacked on the active fin 104 and the isolation layer 106.

The gate insulating layer 140 may include, for example, silicon oxide and/or a metal oxide such as hafnium oxide ($HfO_2$), tantalum oxide ($Ta_2O_5$), zirconium oxide ($ZrO_2$), or the like. In some embodiments, the gate insulating layer 140 may include a stacked structure of a silicon oxide layer and a metal oxide layer. The gate insulating layer 140 may cover sidewalls and a bottom surface of the gate electrode 142.

The gate electrode 142 may include, for example, a metal such as aluminum (Al), copper (Cu), or the like, or a nitride thereof. In some embodiments, the gate electrode 142 may include polysilicon.

The capping pattern 144 may include, for example, an insulating material having an etch selectivity relative to silicon oxide. The capping pattern 144 may include, for example, a nitride such as silicon nitride.

The spacer 118 may be disposed on sidewalls of the gate structures 146. The spacer 118 may include, for example, silicon nitride or silicon oxycarbonitride.

The liner 130 may be disposed on (or extend along) a sidewall of the spacer and a surface of the epitaxial structure 122. The liner 130 may be formed of substantially the same material as the spacer 118.

The epitaxial structure 122 may be disposed in the recess 120 between the gate structures 146. In some embodiments, recesses 120 formed in respective ones of the active fins 104 arranged in the second direction may be arranged in a row in the second direction. Thus, the epitaxial structures 122 in the recesses 120 of adjacent active fins 104 may contact each other to form a single structure connected to (or coupled with) each other in the second direction. The epitaxial structures 122 may be formed in the recesses 120, respectively.

The epitaxial structure 122 may function as a source/drain of a FinFET. The epitaxial structure 122 may be doped with impurities.

The epitaxial structure 122 may include, for example, silicon or silicon germanium. In some embodiments, when the FinFET is an n-type transistor, the epitaxial structure 122 may include silicon and may be doped with n-type impurities. In other embodiments, when the FinFET is a p-type transistor, the epitaxial structure 122 may include silicon germanium and may be doped with p-type impurities.

The first interlayer insulating layer 132 may be disposed on the liner 130 and may fill gaps between the gate structures 146. The first interlayer insulating layer 132 may include, for example, silicon oxide. An etch stop layer 172 may be disposed on the gate structures 146 and the first interlayer insulating layer 132. The second interlayer insulating layer 174 may be disposed on the etch stop layer 172. The second interlayer insulating layer 174 may include, for example, silicon oxide. The etch stop layer 172 may include, for example, silicon nitride, silicon carbonitride, aluminum nitride, or the like.

The first contact structure 190 may include a first lower contact 170a, which may contact the surface of the epitaxial structure 122 between the gate structures 146, and a first upper contact 186a, which may contact an upper surface of the first lower contact 170a. The first contact structure 190 may be electrically connected to the source/drain (i.e., the epitaxial structure 122) of the FinFET.

The first lower contact 170a may be formed to penetrate the liner 130 on the first interlayer insulating layer 132 and the epitaxial structure 122. The spacer 118 and the liner 130 may be disposed at opposite sidewalls of the first lower contact 170a.

The first upper contact 186a may be formed to penetrate the etch stop layer 172 and the second interlayer insulating layer 174. A width of an upper surface of the first upper contact 186a in the first direction may be less than a width of an upper surface of the first lower contact 170a in the first direction.

The second contact structure 192 may include a second lower contact 170b, which may pass through the capping pattern 144 of at least one of the gate structures 146 and contact an upper surface of the gate electrode 142 of the at least one of the gate structures 146, and a second upper contact 186b, which may contact an upper surface of the second lower contact 170b. The second contact structure 192 may be electrically connected to the gate electrode 142 of the FinFET.

The capping pattern 144 may be removed at a portion of the at least one of the gate structures 146 to form an opening, and the second lower contact 170b may fill the opening formed by removing the capping pattern 144. The spacer 118 and the liner 130 may be disposed on opposite sidewalls of the second lower contact 170b.

The second upper contact 186b may be formed to penetrate the etch stop layer 172 and the second interlayer insulating layer 174. A width of an upper surface of the second upper contact 186b in the first direction may be less than a width of an upper surface of the second lower contact 170b in the first direction.

The third contact structure 194 may include a third lower contact 170c, which may penetrate the capping pattern 144 of at least one of the gate structures 146 to contact the upper surface of the gate electrode 142 and which may contact a surface of the active fin 104 adjacent to one sidewall of the at least one of the gate structures 146, and a third upper contact 186c, which may contact an upper surface of the third lower contact 170c. The third contact structure 194 may be electrically connected to the gate electrode 142 and the source/drain of the FinFET.

The capping pattern 144 may be removed at a portion of the at least one of the gate structures 146 to form an opening, and a first portion 171a of the third lower contact 170c may fill the opening formed by removing the capping pattern 144. Additionally, a second portion 171b of the third lower contact 170c may be enlarged in the first direction from the first portion 171a and may contact a surface of the epitaxial structure 122 adjacent to one sidewall of the at least one of the gate structures 146. The spacer 118 and the liner 130 may be disposed on one sidewall of the at least one of the gate structures 146 below the third lower contact 170c. For example, the second portion 171b of the third lower contact 170c may be spaced apart from the gate structure 146 by the spacer 118 and the liner 130. Upper surfaces of the spacer 118 and the liner 130 may be positioned lower than an upper surface of the gate structure 146 adjacent to the third lower contact 170c.

The third upper contact 186c may be formed to penetrate the etch stop layer 172 and the second interlayer insulating layer 174. A width of an upper surface of the third upper contact 186c in the first direction may be less than a width of an upper surface of the third lower contact 170c in the first direction.

In an implementation, the upper surfaces of the first, second, and third lower contacts 170a, 170b, and 170c may be substantially coplanar with an upper surface of the capping pattern 144. In an implementation, the upper surfaces of the first, second, and third lower contacts 170a, 170b, and 170c may be substantially coplanar with an upper surface of the first interlayer insulating layer 132.

In an implementation, the upper surfaces of the first, second, and third upper contacts 186a, 186b, and 186c may be substantially coplanar with an upper surface of the second interlayer insulating layer 174.

The first, second, and third lower contacts 170a, 170b, and 170c may include a first metal. The first metal may include, for example, one or more of cobalt, aluminum, copper, tungsten, nickel, platinum, gold, or silver.

The first, second, and third lower contacts 170a, 170b, and 170c may each have a structure in which a first barrier metal pattern 169a and a first metal pattern are stacked. The first barrier metal pattern 169a may include, for example, titanium, titanium nitride, tantalum, tantalum nitride, or the like. The first metal pattern may include the first metal.

The first, second, and third upper contacts 186a, 186b, and 186c may include a second metal. The second metal may include, for example, one or more of cobalt, aluminum, copper, tungsten, nickel, platinum, gold, or silver. The second metal may be the same as or different from the first metal.

The first, second, and third upper contacts 186a, 186b, and 186c may each have a structure in which a second barrier metal pattern 185a and a second metal pattern are stacked. The second barrier metal pattern 185a may be interposed between the respective upper and lower contacts. The second barrier metal pattern 185a may include, for example, titanium, titanium nitride, tantalum, tantalum nitride, or the like, and may be a different material than the first and/or second metals. The second metal pattern may include the second metal.

In an embodiment, the semiconductor device may include the substrate 100 having an active region in the shape of a fin, e.g., active fin 104, that extends in the first direction, the fin having a plurality of source/drain regions spaced apart therein, e.g., epitaxial structures 122. The gate structures 146 may cross the fin in regions between the source/drain regions, and each of the gate structures 146 may include a respective gate electrode 142. The first contact structure 190 may be in electrical contact with a first one of the source/drain regions. The first contact structure 190 may include the first lower contact 170a and the first upper contact 186a directly on the first lower contact 170a. The second contact structure 192 may be in electrical contact with a gate electrode 142 of a first one of the gate structures 146. The second contact structure 192 may include the second lower contact 170b and the second upper contact 186b directly on the second lower contact 170b. The third contact structure 194 may be in electrical contact with a gate electrode 142 of a second one of the gate structures 146 and in electrical contact with a second one of the source drain regions. The third contact structure 194 may include the third lower contact 170c and the third upper contact 186c directly on the third lower contact 170c.

As described above, each of the first, second, and third contact structures 190, 192, and 194 may have a structure in which the upper contact is stacked on the lower contact. Thus, the first, second, and third contact structures 190, 192, and 194 may each include the upper and lower contacts having independent shapes. An interval between the upper contacts of the first, second, and third contact structures 190, 192, and 194 may be increased, e.g., the upper contacts of the first, second, and third contact structures 190, 192, and 194 may be separated by a greater distance in the first direction, and thus a parasitic capacitance between the first, second, and third contact structures 190, 192, and 194 may be reduced. Additionally, the first, second, and third lower contacts 170a, 170b, and 170c and the first, second, and third upper contacts 186a, 186b, and 186c may be formed by a separate process. Thus, a misalignment margin may be increased in the process of forming the first, second, and third contact structures 190, 192, and 194. Accordingly, a short-circuit between the first, second, and third contact structures 190, 192, and 194 may be reduced or prevented.

FIGS. 3 to 16 are cross-sectional views of stages in a method of manufacturing a semiconductor device according to example embodiments.

FIGS. 3 to 16 are cross-sectional views taken along line I-I' of FIG. 2A or FIG. 2B.

Figure 3:
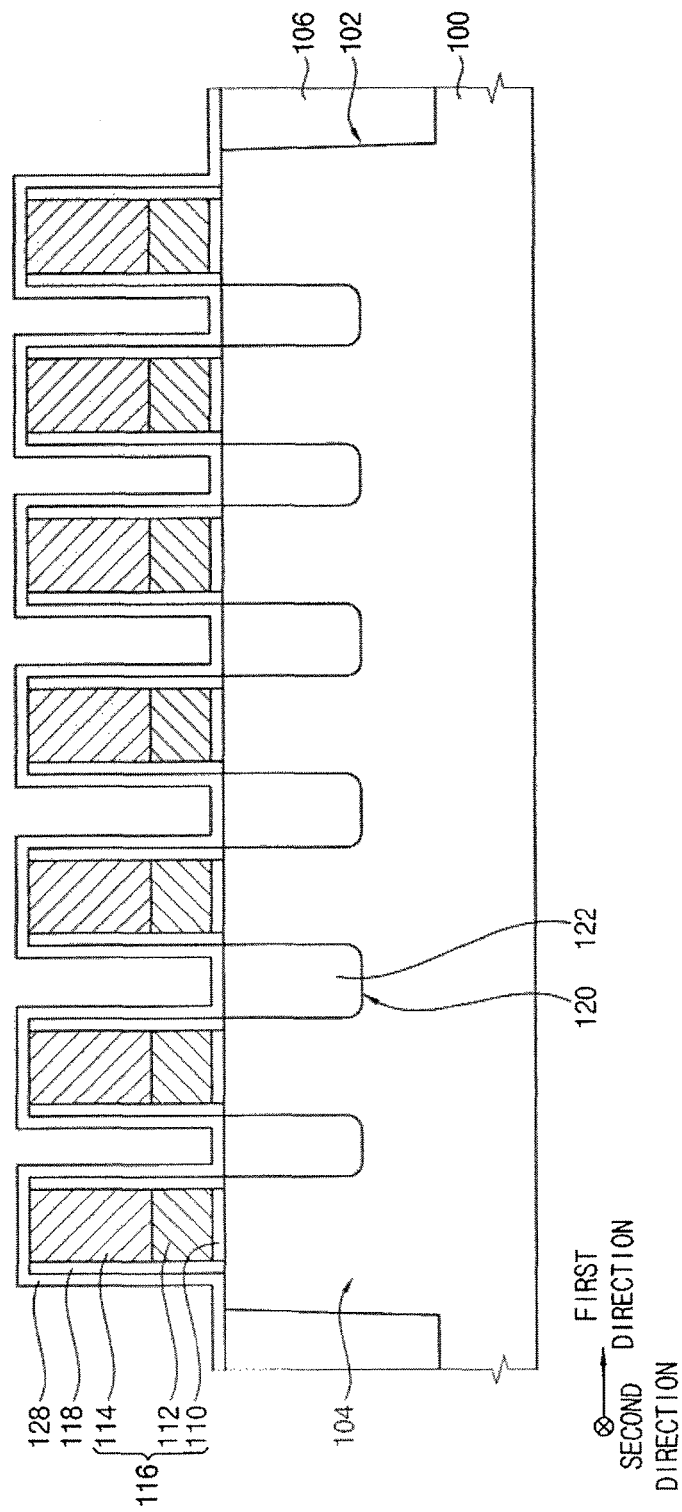
FIGS. 3 to 16 illustrate cross-sectional views of stages in a method of manufacturing a semiconductor device according to example embodiments.

Referring to FIG. 3, an upper portion of a substrate 100 may be partially etched to form trenches 102 extending in a first direction, and then an isolation layer 106 may be formed to fill lower portions of the trenches 102. Before forming the trenches 102, a well region may be formed by implanting impurities into the substrate 100 through an impurity implantation process.

In some embodiments, the isolation layer 106 may be formed by forming an insulating layer on the substrate 100 to sufficiently fill the trenches 102 and removing a portion of the insulating layer to expose upper sidewalls of the trenches 102 after planarizing the insulating layer to expose an upper surface of the substrate 100. The insulating layer may include, for example, silicon oxide.

The isolation layer 106 may be formed in the trenches 102. Thus, preliminary active fins extending in the first direction may be formed on the substrate 100. In some embodiments, the preliminary active fins may be spaced a certain distance apart from one another in a second direction crossing or perpendicular to the first direction.

Dummy gate structures 116 may be formed on the substrate 100. A spacer 118 may be formed on opposite sidewalls of each of the dummy gate structures 116.

The dummy gate structures 116 may be formed by sequentially forming a dummy gate insulating layer, a dummy gate electrode layer, and a hard mask layer on the preliminary active fins of the substrate 100 and the isolation layer 106, and, after forming a hard mask 114 by patterning the hard mask layer through a photolithography/etching process using a photoresist pattern, sequentially etching the dummy gate electrode layer and the dummy gate insulating layer using the hard mask 114 as an etching mask. Thus, the dummy gate structures 116 may each include a dummy gate insulating pattern 110, a dummy gate electrode 112, and the hard mask 114 that are sequentially stacked on the preliminary active fins of the substrate 100 and the isolation layer 106.

The dummy gate insulating layer may include, for example, an oxide such as silicon oxide. The dummy gate electrode layer may include, for example, polysilicon. The hard mask layer may include, for example, a nitride such as silicon nitride.

In some embodiments, the dummy gate structures 116 may extend in the second direction and may be spaced a certain distance apart from one another in the first direction.

A spacer layer may be formed on the dummy gate structures 116, the isolation layer 106, and the preliminary active fins. The spacer layer may be anisotropically etched to form the spacer 118 on the sidewalls of the dummy gate structures 116.

The preliminary active fins may be partially etched using the dummy gate structures 116 and the spacer 118 as an etching mask to form a recess 120. An active fin 104 including a first pattern extending in the first direction and a second pattern protruding from the first pattern may be formed.

In some embodiments, the etching process for forming the spacer 118 and the recess 120 may be performed in-situ.

An epitaxial structure 122 may be formed to fill the recess 120. In some embodiments, the epitaxial structure 122 in the recess 120 may extend in the second direction.

A selective epitaxial growth (SEG) process may be performed using a surface of the active fin 104 exposed by the recess 120 as a seed. The epitaxial structure 122 may be formed by epitaxially growing in a vertical direction and a lateral direction In some embodiments, impurities may be doped in situ when performing the epitaxial growth process. The epitaxial structure 122 may serve as a source/drain of a FinFET.

In some embodiments, the epitaxial structure 122 may include, for example, silicon germanium or silicon. For example, when the semiconductor device is a p-type FinFET, the epitaxial structure 122 may include silicon germanium. When the semiconductor device is an n-type FinFET, the epitaxial structure 122 may include silicon.

In some embodiments, after forming the epitaxial structure 122, an impurity injection process and an annealing process for forming the source/drain may be further performed.

A liner layer 128 may be formed on the dummy gate structures 116, the spacer 118, the epitaxial structure 122, and the isolation layer 106. The liner layer 128 may include, for example, silicon nitride, silicon carbonitride, aluminum nitride, or the like.

Figure 4:
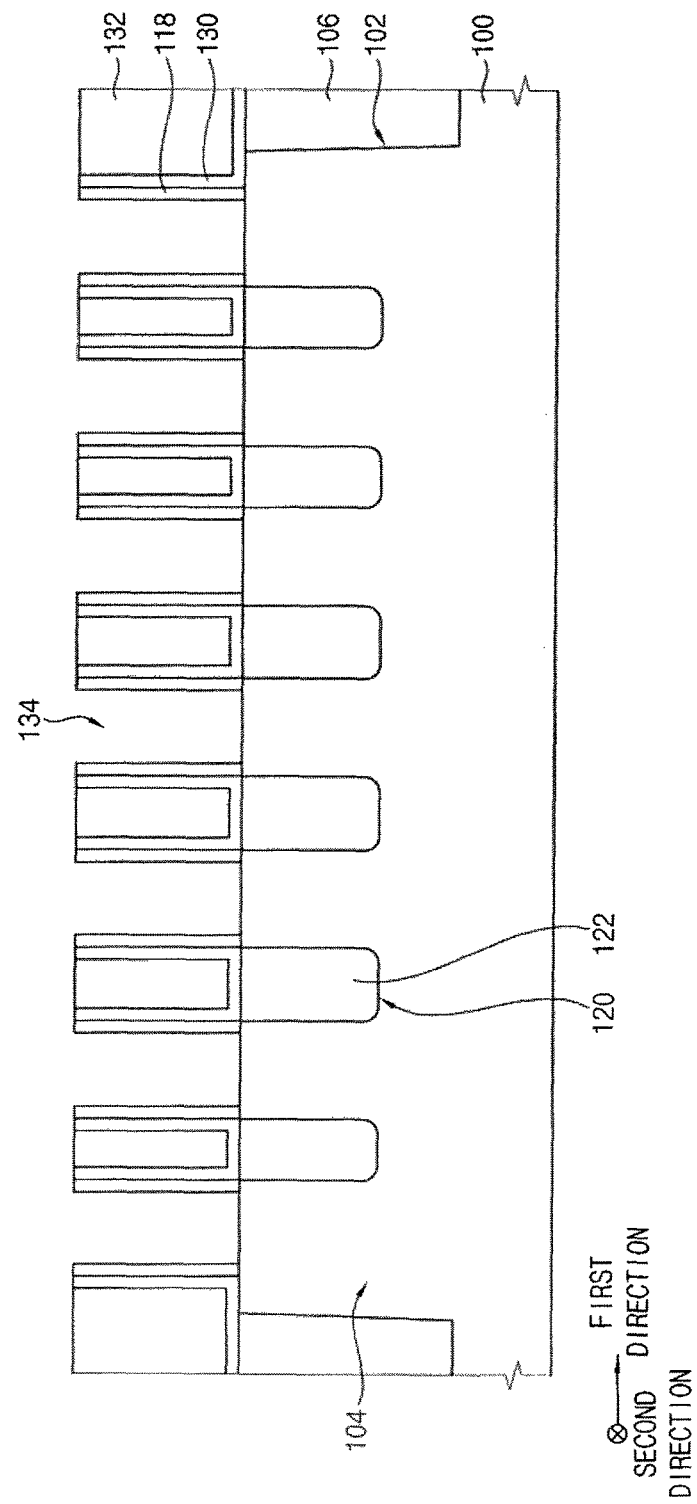

Referring to FIG. 4, a first interlayer insulating layer 132 may be formed on the liner layer 128 to sufficiently fill gaps between the dummy gate structures 116 and cover the dummy gate structures 116. Thereafter, the first interlayer insulating layer 132 may be planarized until exposing upper surfaces of the dummy gate structures 116. In the planarization process, an upper portion of the liner layer 128 may be removed to form a liner 130.

In some embodiments, the first interlayer insulating layer 132 may include silicon oxide. The planarization process on the first interlayer insulating layer 132 may include a chemical mechanical polishing (CMP) process and/or an etch-back process.

The dummy gate structures 116 may be removed to form an opening 134. Thus, the active fin 104 and the isolation layer 106 may be exposed at a bottom of the opening 134. In some embodiments, a thermal oxide layer may be further formed on the active fin 104 exposed on the bottom surface of the opening 134.

Figure 5:
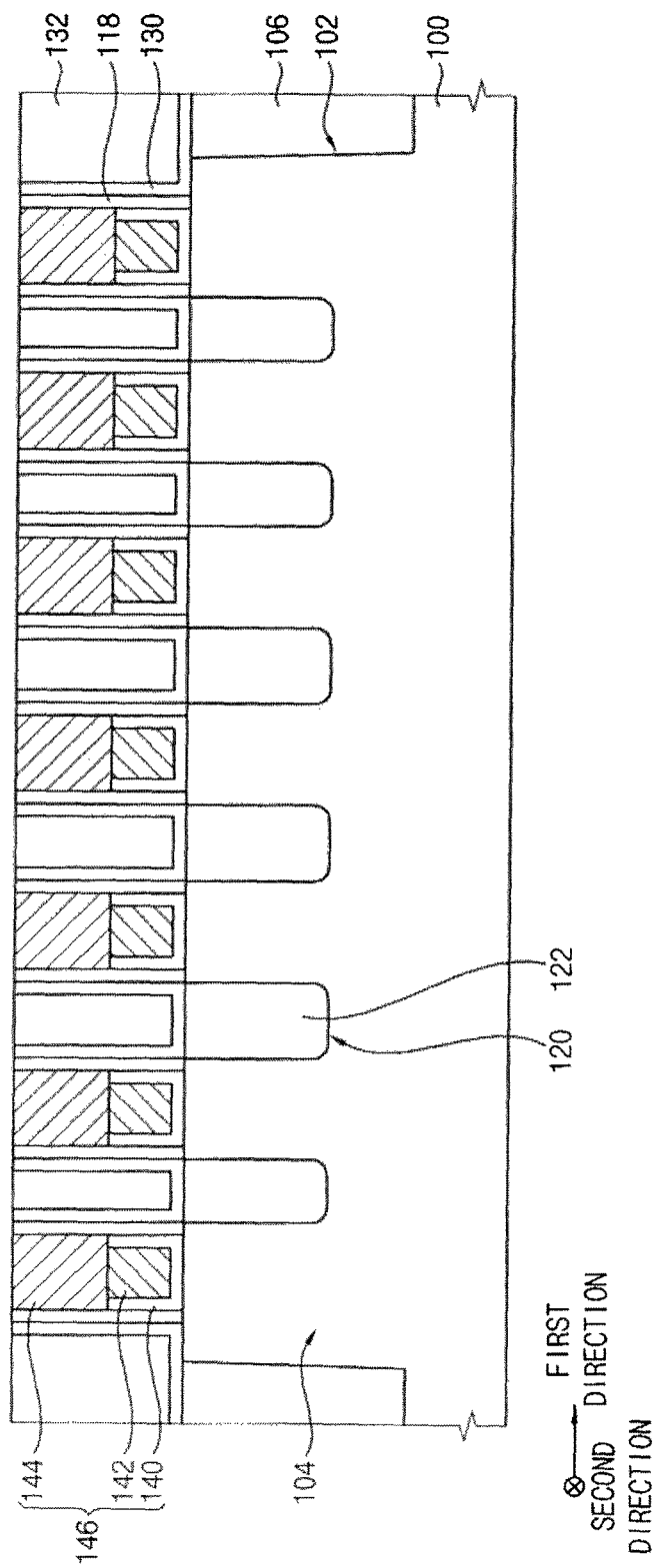

Referring to FIG. 5, a gate structure 146 including a gate insulating layer 140, a gate electrode 142, and a capping pattern 144 may be formed in the opening 134.

In some embodiments, a high-k dielectric layer may be formed on an inner sidewall of the opening 134, the thermal oxide layer, and the first interlayer insulating layer 132, and a gate electrode layer may be formed on the high-k dielectric layer to fill a remaining portion of the opening 134. The high-k dielectric layer may include, for example, a metal oxide such as hafnium oxide ($HfO_2$), tantalum oxide ($Ta_2O_5$), zirconium oxide ($ZrO_2$), or the like. The gate electrode layer may be formed by, for example, an atomic layer deposition (ALD) process, a physical vapor deposition (PVD) process, or the like using, for example, a low resistivity metal. The low resistivity metal may include a metal such as aluminum, copper, tantalum, or the like, or a nitride thereof.

Thereafter, the gate electrode layer and the high-k dielectric layer may be planarized until exposing an upper surface of the first interlayer insulating layer 132, and an upper portion of the gate electrode layer may be partially etched. Thus, the gate insulating layer 140 may be formed on an inner surface of the opening 134, and the gate electrode 142 may be formed on the gate insulating layer 140 to fill a portion of the opening 134. In some embodiments, the planarization process on the gate electrode layer and the high-k dielectric layer may be performed by a CMP process and/or an etch-back process. A capping layer may be formed on an upper surface of the gate electrode 142 and may be planarized to form the capping pattern 144.

Thus, the gate structure 146 in which the gate insulating layer 140, the gate electrode 142, and the capping pattern 144 are sequentially stacked may be formed. The gate structure 146 may include a plurality of gate structures 146 formed on the active fin 104.

Figure 6:
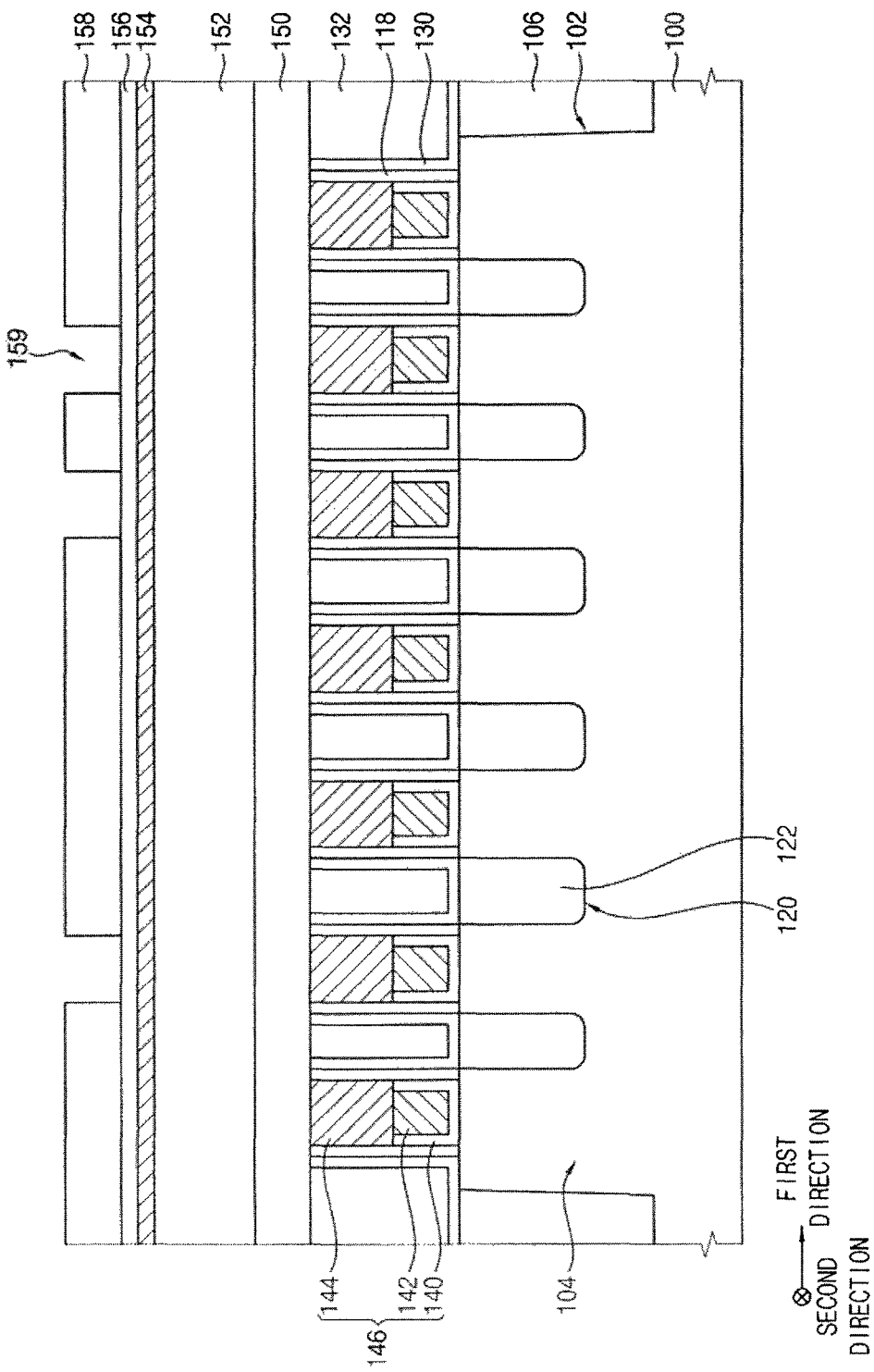

Referring to FIG. 6, a sacrificial interlayer insulating layer 150 may be formed on the first interlayer insulating layer 132 and the gate structures 146. The first sacrificial layer 152 may be formed the sacrificial interlayer insulating layer 150. A first hard mask layer 154 and a first bottom anti-reflective coating (BARC) layer 156 may be sequentially formed on the first sacrificial layer 152. A first photoresist pattern 158 may be formed on the first BARC layer 156.

The sacrificial interlayer insulating layer 150 may include, for example, silicon oxide. The sacrificial interlayer insulating layer 150 may be formed of, for example, a tetraethyl orthosilicate (TEOS) material.

The first sacrificial layer 152 may be formed of, for example, a material capable of being easily removed by an ashing process. In some embodiments, the first sacrificial layer 152 may include a spin-on hard mask film including amorphous carbon. The first hard mask layer 154 may include, for example, silicon oxynitride.

The first photoresist pattern 158 may include a first opening 159 selectively exposing a portion of the first BARC layer 156 corresponding to respective portions of some of the gate structures 146 in which a second lower contact 170b (refer to FIG. 12) and a first portion 171a of a third lower contact 170c (refer to FIG. 12) are to be formed. The first photoresist pattern 158 may be used as an etch mask for forming the second lower contact and the first portion of the third lower contact.

Figure 7:
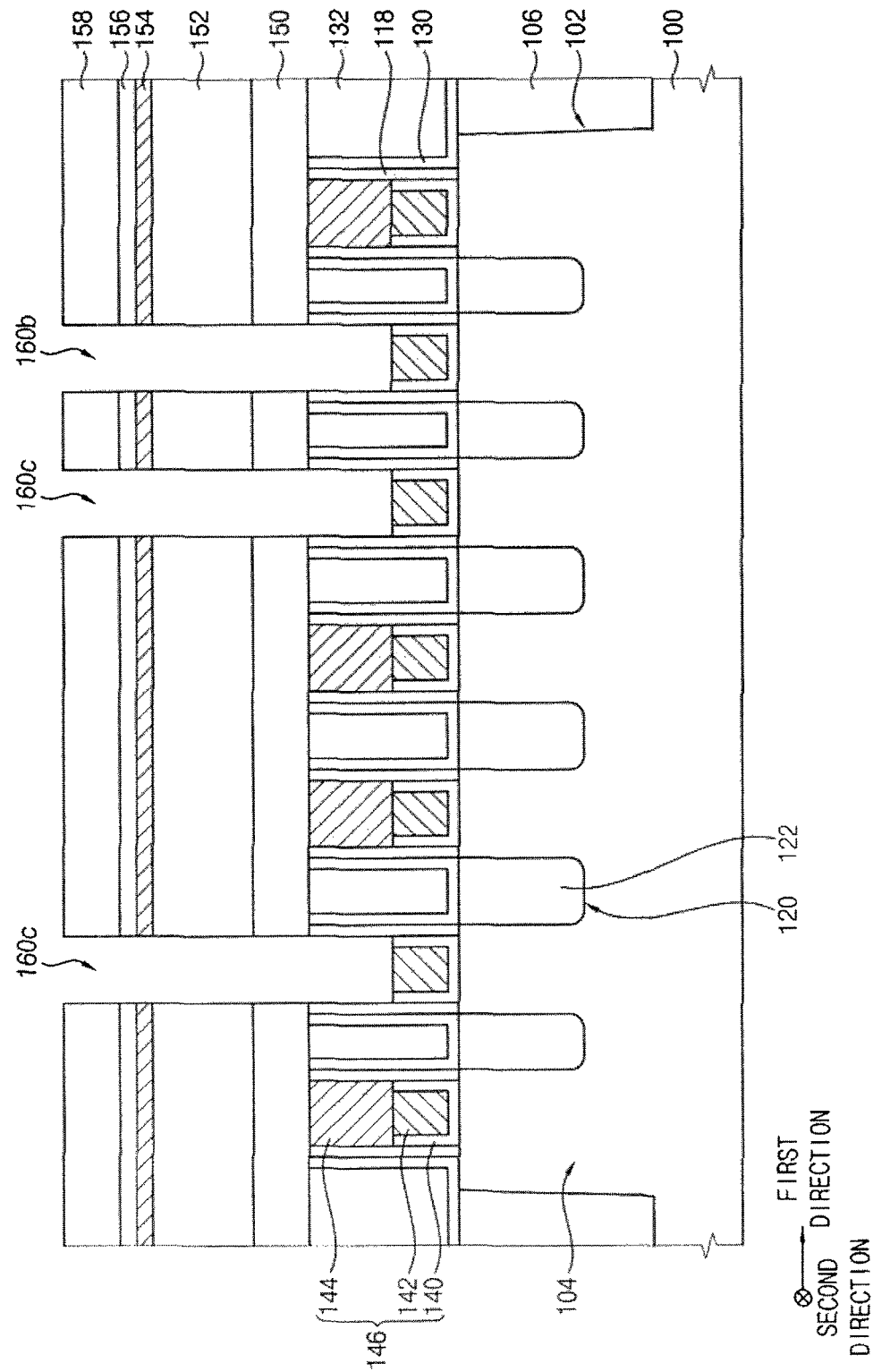

Referring to FIG. 7, the first BARC layer 156, the first hard mask layer 154, the first sacrificial layer 152, the sacrificial interlayer insulating layer 150, and the capping pattern 144 may be sequentially etched using the first photoresist pattern 158 as the etching mask.

Accordingly, a second contact hole 160b may be formed in a region in which the second lower contact is to be formed, and a preliminary third contact hole 160c may be formed in a region in which the first portion of the third lower contact is to be formed. The second contact hole 160b and the preliminary third contact hole 160c may be formed to penetrate the sacrificial interlayer insulating layer 150 and the capping pattern 144. The second contact hole 160b and the preliminary third contact hole 160c may expose the upper surface of the gate electrode 142. In some embodiments, the spacer 118 may be exposed on sidewalls of the second contact hole 160b and the preliminary third contact hole 160c.

Figure 8:
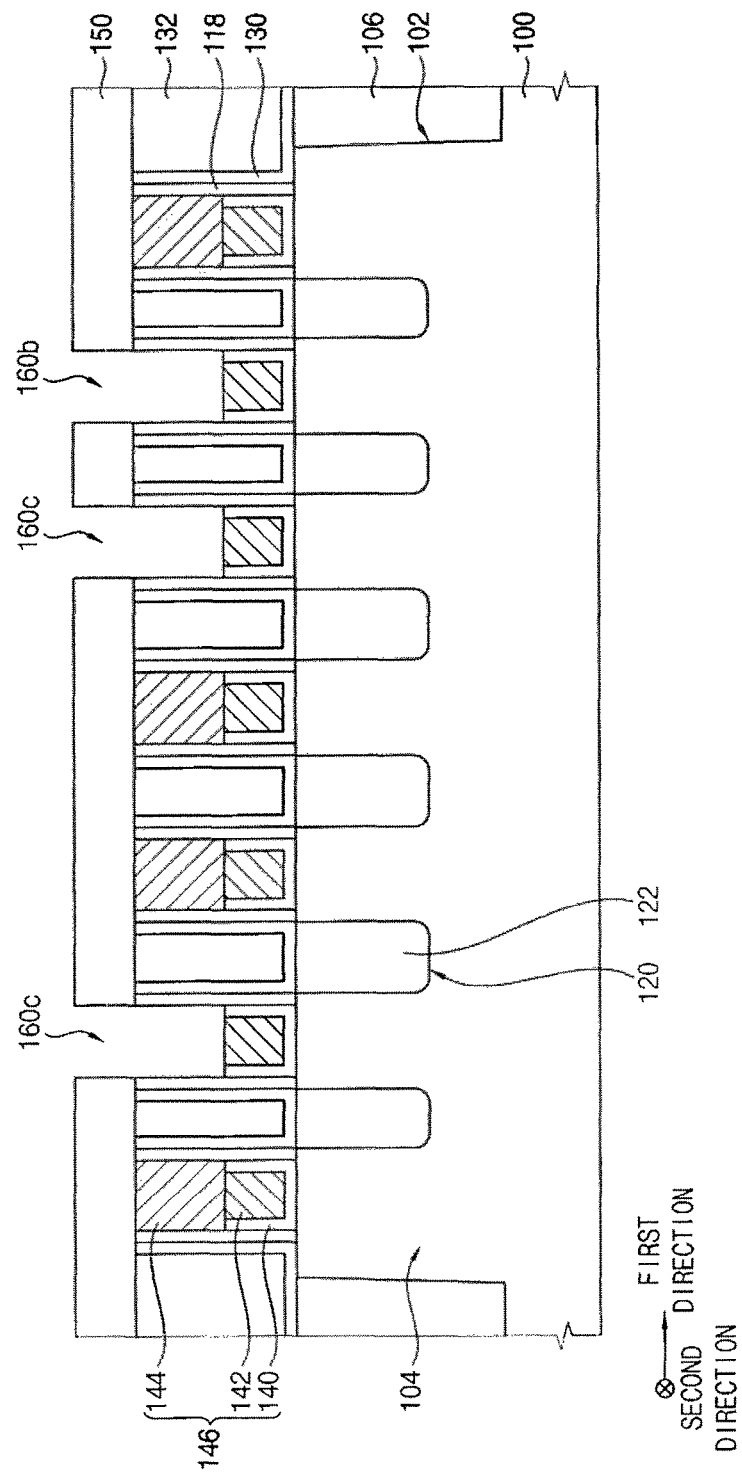

Referring to FIG. 8, the first sacrificial layer 152, the first hard mask layer 154, the first BARC layer 156, and the first photoresist pattern 158 that are formed on the sacrificial interlayer insulating layer 150 may be removed. The removing process may include an ashing process.

Accordingly, the first interlayer insulating layer 132 and the sacrificial interlayer insulating layer 150 that cover the gate structures 146 may remain on the active fin 104 and the isolation layer 106. In some embodiments, the first interlayer insulating layer 132 and the sacrificial interlayer insulating layer 150 may be combined into a unitary layer.

Figure 9:
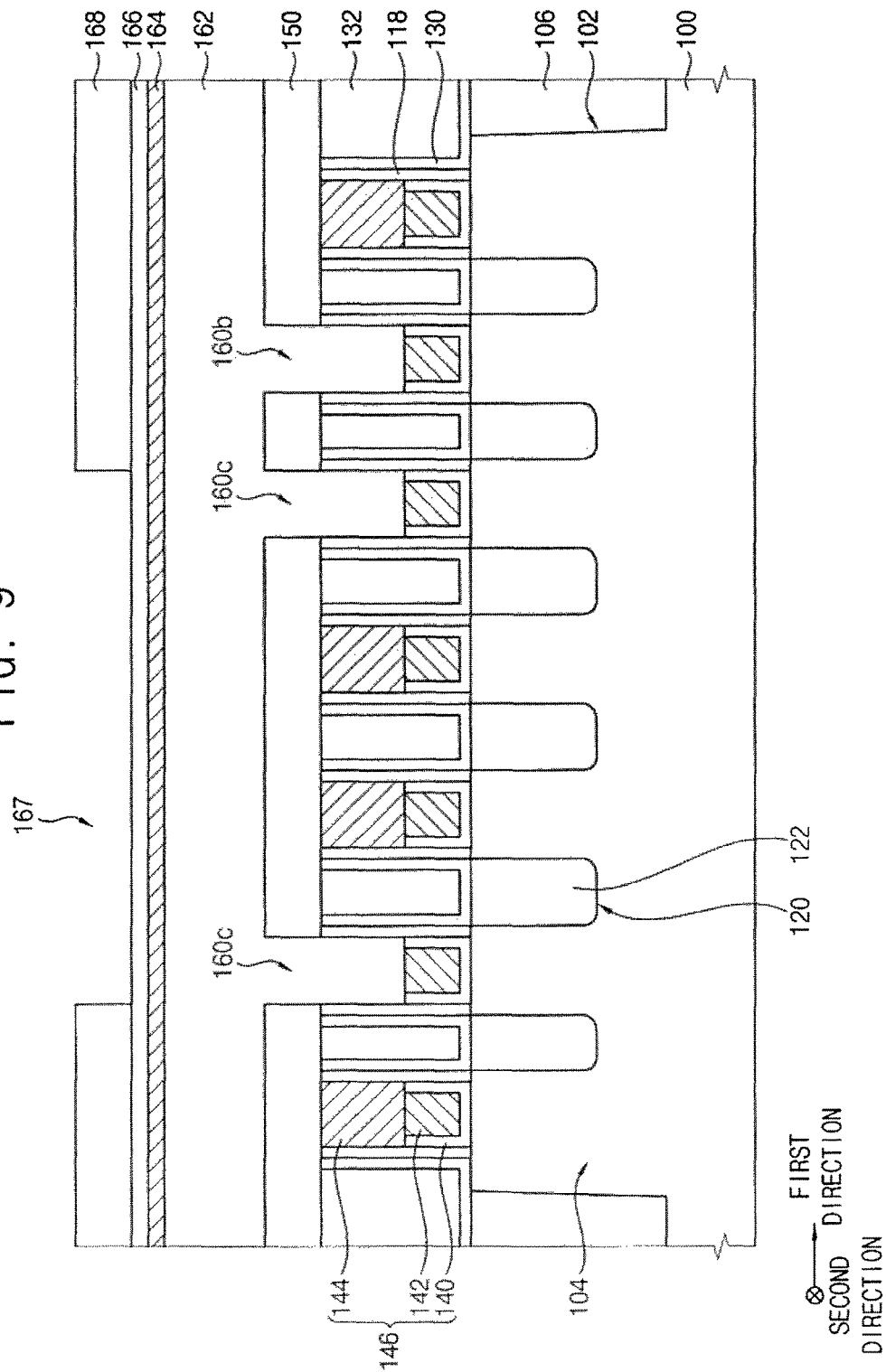

Referring to FIG. 9, a second sacrificial layer 162 may be formed on the first interlayer insulating layer 132, the sacrificial interlayer insulating layer 150, and the gate electrode 142 to fill the second contact hole 160b and the preliminary third contact hole 160c and cover the sacrificial interlayer insulating layer 150. The second sacrificial layer 162 may be formed of, for example, a material capable of being easily removed through an ashing process. In some embodiments, the second sacrificial layer 162 may include a spin-on hard mask film including amorphous carbon. As an example, the second sacrificial layer 162 may be the same material as the first sacrificial layer 152.

A second hard mask layer 164, a second BARC layer 166, and a second photoresist pattern 168 may be formed on the second sacrificial layer 162.

The second photoresist pattern 168 may include a second opening 167 exposing a portion of the second BARC corresponding to a region in which a first lower contact 170a (refer to FIG. 12) and a second portion 171b of the third lower contact 170c (refer to FIG. 12) are to be formed. In some embodiments, when viewed in plan view, a region in which the first lower contact is to be formed, the second contact hole 160b adjacent to the first lower contact and the preliminary third contact hole 160c may be disposed in the second opening 167. Thus, a width of the second opening 167 in the first direction may be greater than a sum of widths in the first direction, of the first lower contact and the second portion of the third lower contact to be formed. In some embodiments, the second opening 167 may have a linear shape extending in the second direction. In other embodiments, the second opening 167 may have a hole shape which is isolated in the first and second directions.

Figure 10:
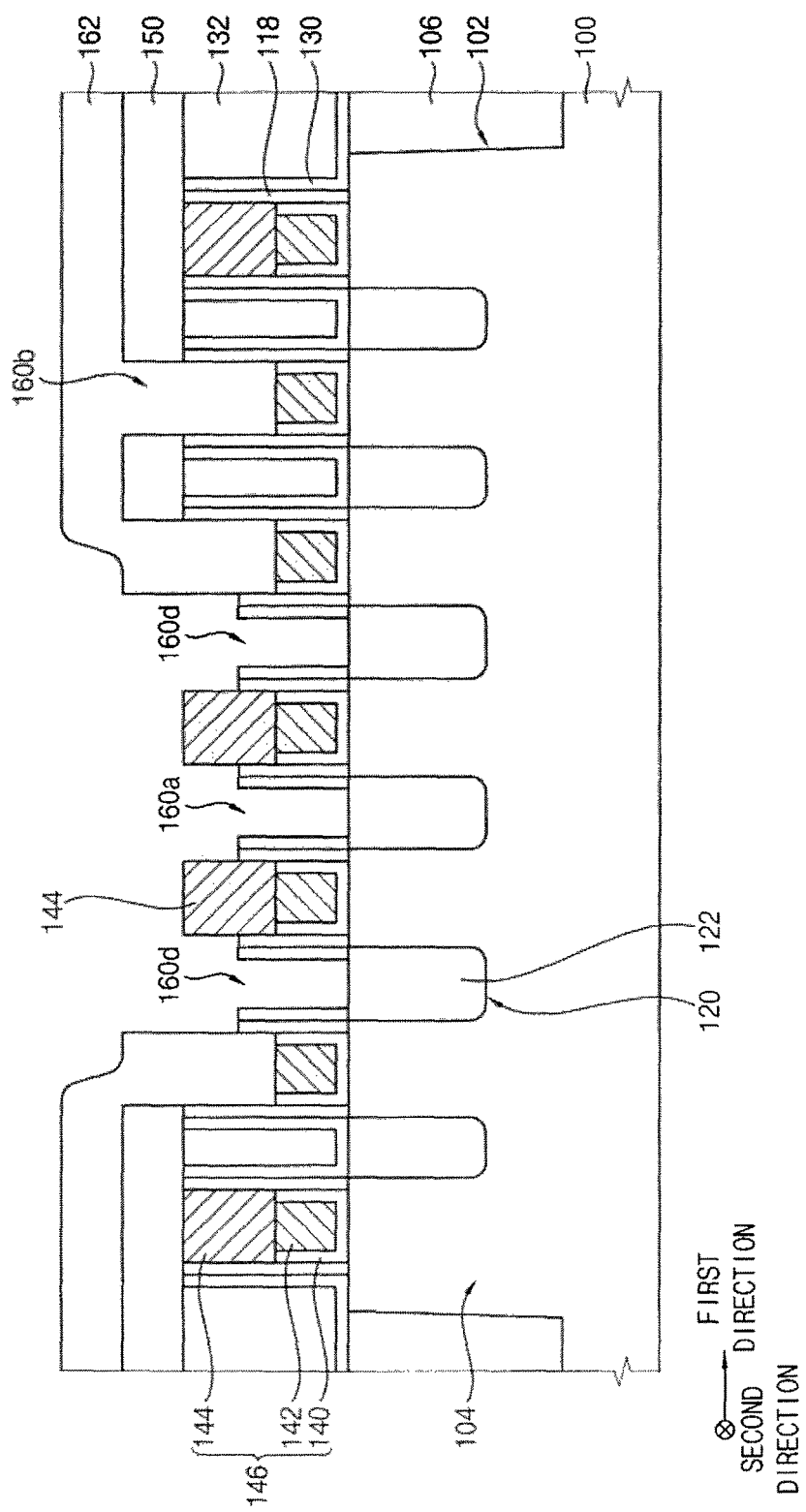

Referring to FIG. 10, the second BARC layer 166, the second hard mask layer 164, the second sacrificial layer 162, the sacrificial interlayer insulating layer 150, and the first interlayer insulating layer 132 may be sequentially etched using the second photoresist pattern 168 as an etching mask.

Before performing the etching process, the second sacrificial layer 162 may fill the second contact hole 160b and the preliminary third contact hole 160c. The second sacrificial layer 162 may not be entirely removed during the etching process. Thus, the second sacrificial layer 162 may protect the gate electrode 142 under the second contact hole 160b and the preliminary third contact hole 160c during the etching process.

A first contact hole 160a may be formed in the region in which the first lower contact is to be formed, through the etching process. Additionally, the first interlayer insulating layer 132 adjacent to the preliminary third contact hole 160c may be etched to form a third contact hole 160d in the region in which the third lower contact is to be formed. The first contact hole 160a may penetrate the sacrificial interlayer insulating layer 150 and the first interlayer insulating layer 132. Additionally, the third contact hole 160d may penetrate the sacrificial interlayer insulating layer 150, the first interlayer insulating layer 132, and the capping pattern 144.

Accordingly, the first contact hole 160a may expose a surface of the epitaxial structure 122. The third contact hole 160d may expose the upper surface of the gate electrode 142 and the surface of the epitaxial structure 122 together.

In some embodiments, some of the first, second, and third contact holes 160a, 160b, and 160d may be disposed adjacent to each other with the gate structure 146 therebetween. In this case, the capping pattern 144 of the gate structure 146 may be exposed between the first, second, and third contact holes 160a, 160b, and 160d.

Figure 11:
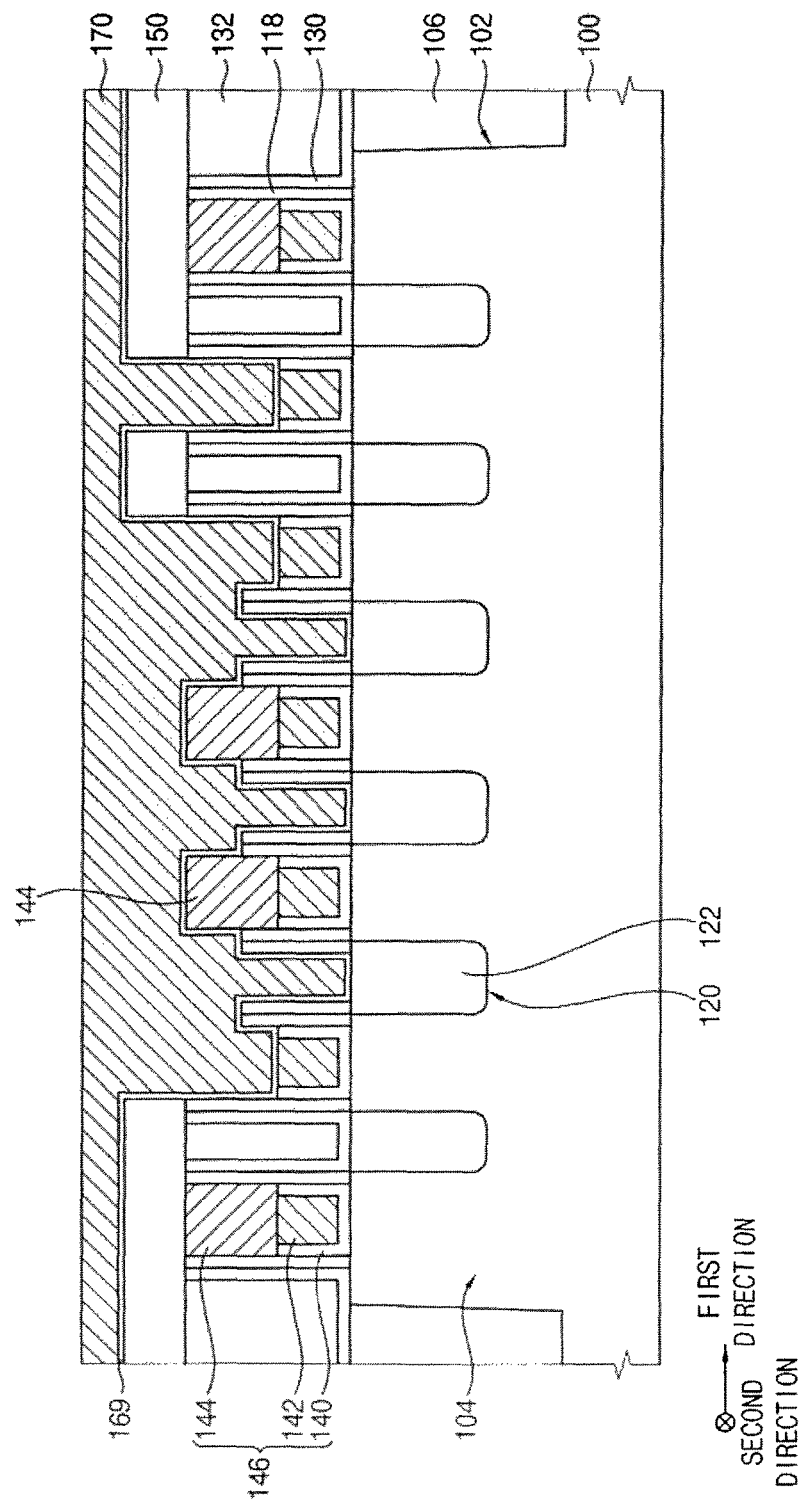

Referring to FIG. 11, the second sacrificial layer 162 may be removed by, for example, an ashing process such that the first, second, and third contact holes 160a, 160b, and 160d may be respectively formed.

Thereafter, a first barrier metal layer 169 may be formed to extend on the sacrificial interlayer insulating layer 150 and inner surfaces of the first, second, and third contact holes 160a, 160b, and 160d. A first metal layer 170 may be formed on the first barrier metal layer 169 to fill the first, second, and third contact holes 160a, 160b, and 160d and extend on the sacrificial interlayer insulating layer 150.

The first barrier metal layer 169 may include, for example, titanium, titanium nitride, tantalum, tantalum nitride, or the like. The first metal layer 170 may include, for example, one or more of cobalt, aluminum, copper, tungsten, nickel, platinum, gold, or silver.

Figure 12:
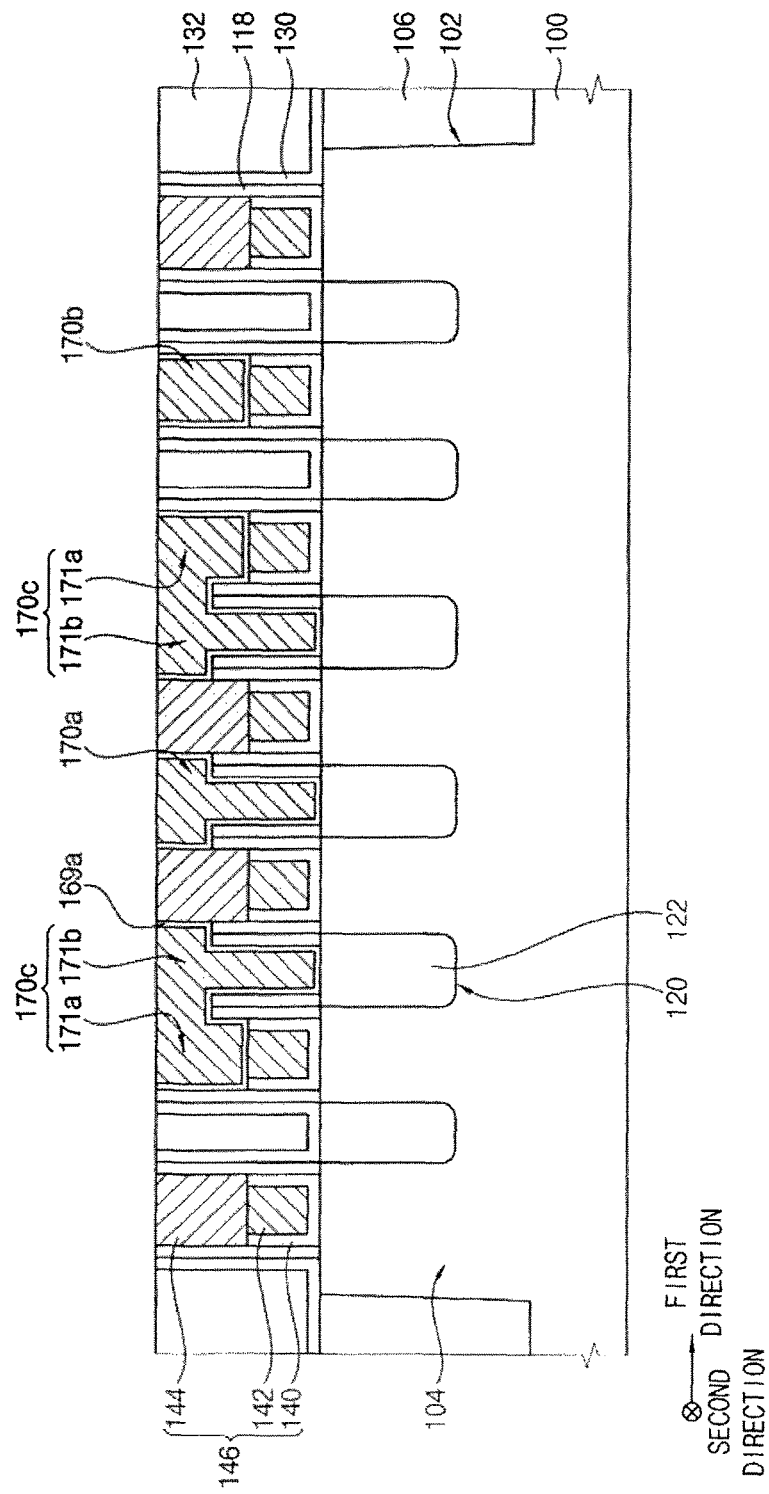

Referring to FIG. 12, the first barrier metal layer 169, the first metal layer 170, and the sacrificial interlayer insulating layer 150 may be planarized until exposing upper surfaces of the capping pattern 144 and the first interlayer insulating layer 132. The planarization process may include a CMP process or an etch-back process. First, second, and third lower contacts 170a, 170b, and 170c may be formed in the first, second, and third contact holes 160a, 160b, and 160d, respectively. The first, second, and third lower contacts 170a, 170b, and 170c may each include a stacked structure of a first barrier metal pattern 169a and a first metal pattern.

The first lower contact 170a may contact the surface of the epitaxial structure 122 between the gate structures 146. The second lower contact 170b may penetrate the capping pattern 144 of at least one of the gate structures 146 to contact the upper surface of the gate electrode 142 of the at least one of the gate structures 146. The capping pattern 144 may be removed in the region in which the second lower contact 170b is formed. The third lower contact 170c may penetrate the capping pattern 144 of at least one of the gate structures 146 and may contact the upper surface of the gate electrode 142 of the at least one of the gate structures 146, and may contact the surface of the epitaxial structure 122 adjacent to one sidewall of the at least one of the gate structures 146 as well. A portion of the third lower contact 170c contacting the gate electrode 142 may form a first portion 171a, and the other portion thereof contacting the epitaxial structure 122 may form a second portion 171b.

Figure 13:
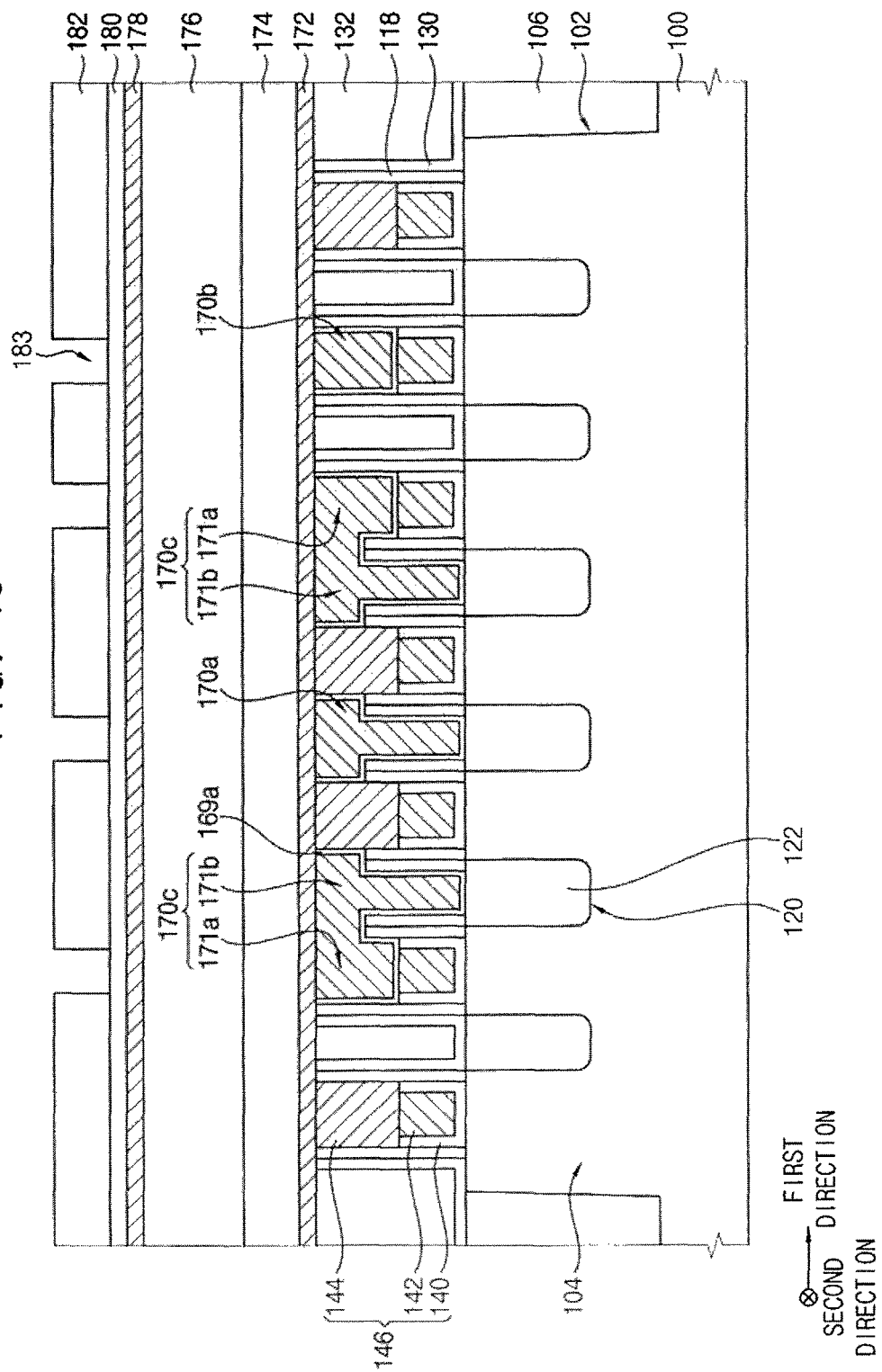

Referring to FIG. 13, an etch stop layer 172 may be formed on the capping pattern 144, the first interlayer insulating layer 132, and the first, second, and third lower contacts 170a, 170b, and 170c. A second interlayer insulating layer 174 may be formed on the etch stop layer 172. A third sacrificial layer 176, a third hard mask layer 178, a third BARC layer 180, and a third photoresist pattern 182 may be formed on the second interlayer insulating layer 174.

The etch stop layer 172 may cover and protect the first, second, and third lower contacts 170a, 170b, and 170c. The etch stop layer 172 may be formed of, for example, a material having etch resistance in a dry or wet etching process. The etch stop layer 172 may include, for example, silicon nitride, silicon carbonitride, aluminum nitride or the like.

The third photoresist pattern 182 may include a third opening 183 corresponding to a region in which first, second, and third upper contacts are to be formed. The third opening 183 may be located to overlap with at least a portion of an upper surface of each of the first, second, and third lower contacts 170a, 170b, and 170c. In some embodiments, a width in the first direction of the third opening 183 opposite to the first lower contact 170a may be less than a width of the upper surface of the first lower contact 170a in the first direction. A width in the first direction of the third opening 183 opposite to the second lower contact 170b may be less than a width of the upper surface of the second lower contact 170b in the first direction. Additionally, a width in the first direction of the third opening 183 opposite to the third lower contact 170c may be less than a width of the upper surface of the third lower contact 170c in the first direction.

Figure 14:
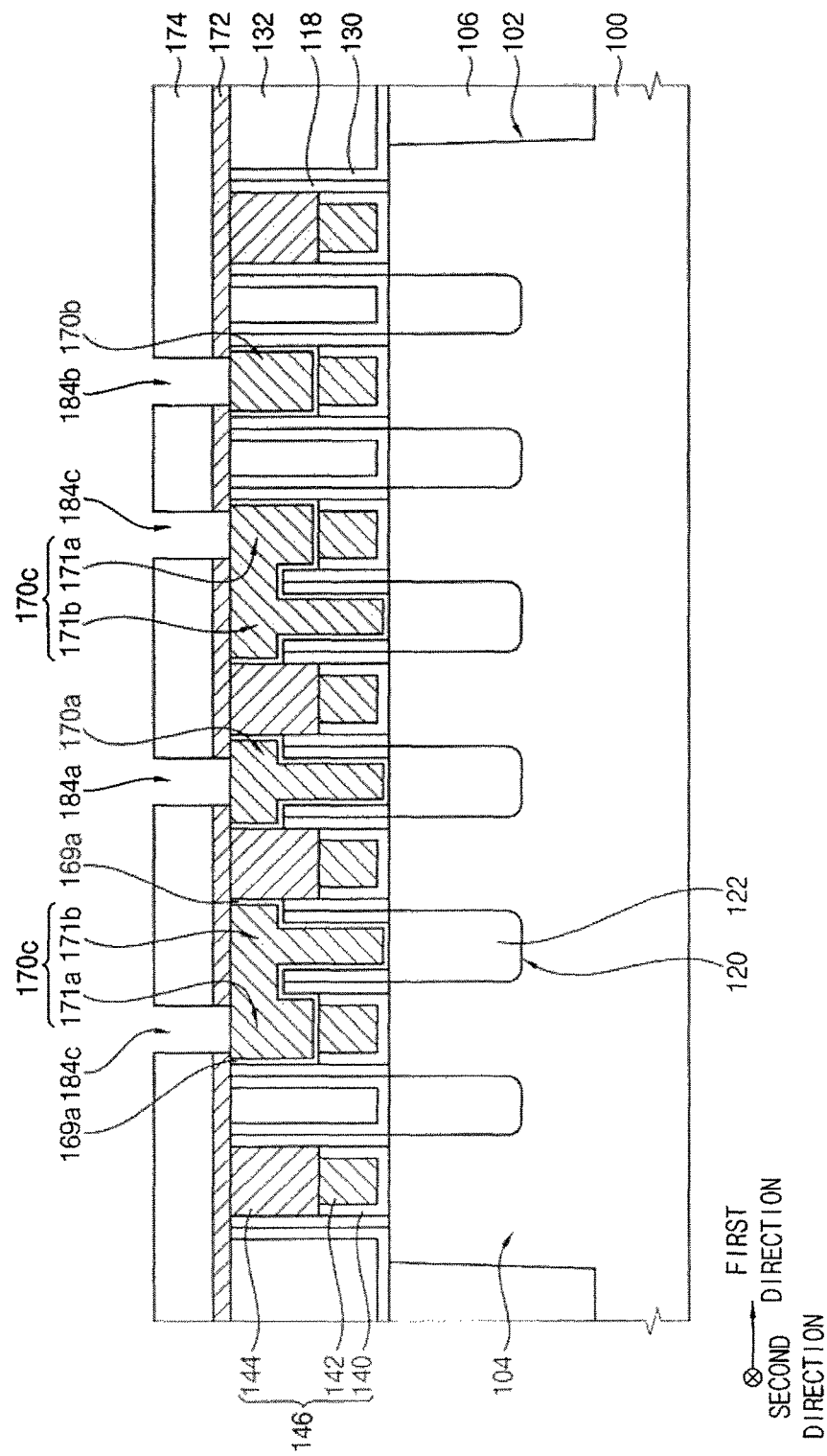

Referring to FIG. 14, the third BARC layer 180, the third hard mask layer 178, the third sacrificial layer 176, the second interlayer insulating layer 174, and the etch stop layer 172 may be sequentially etched using the third photoresist pattern 182 as an etching mask.

Accordingly, fourth, fifth and sixth contact holes 184a, 184b, and 184c exposing the upper surfaces of the first, second, and third lower contacts 170a, 170b, and 170c, respectively, may be formed.

While forming the fourth, fifth and sixth contact holes 184a, 184b, and 184c, the third BARC layer 180 and the third hard mask layer 178 may be removed together. Thus, after the fourth, fifth and sixth contact holes 184a, 184b, and 184c are formed, the third sacrificial layer 176 may be exposed.

Thereafter, the third sacrificial layer 176 may be removed, for example, by an ashing process.

Figure 15:
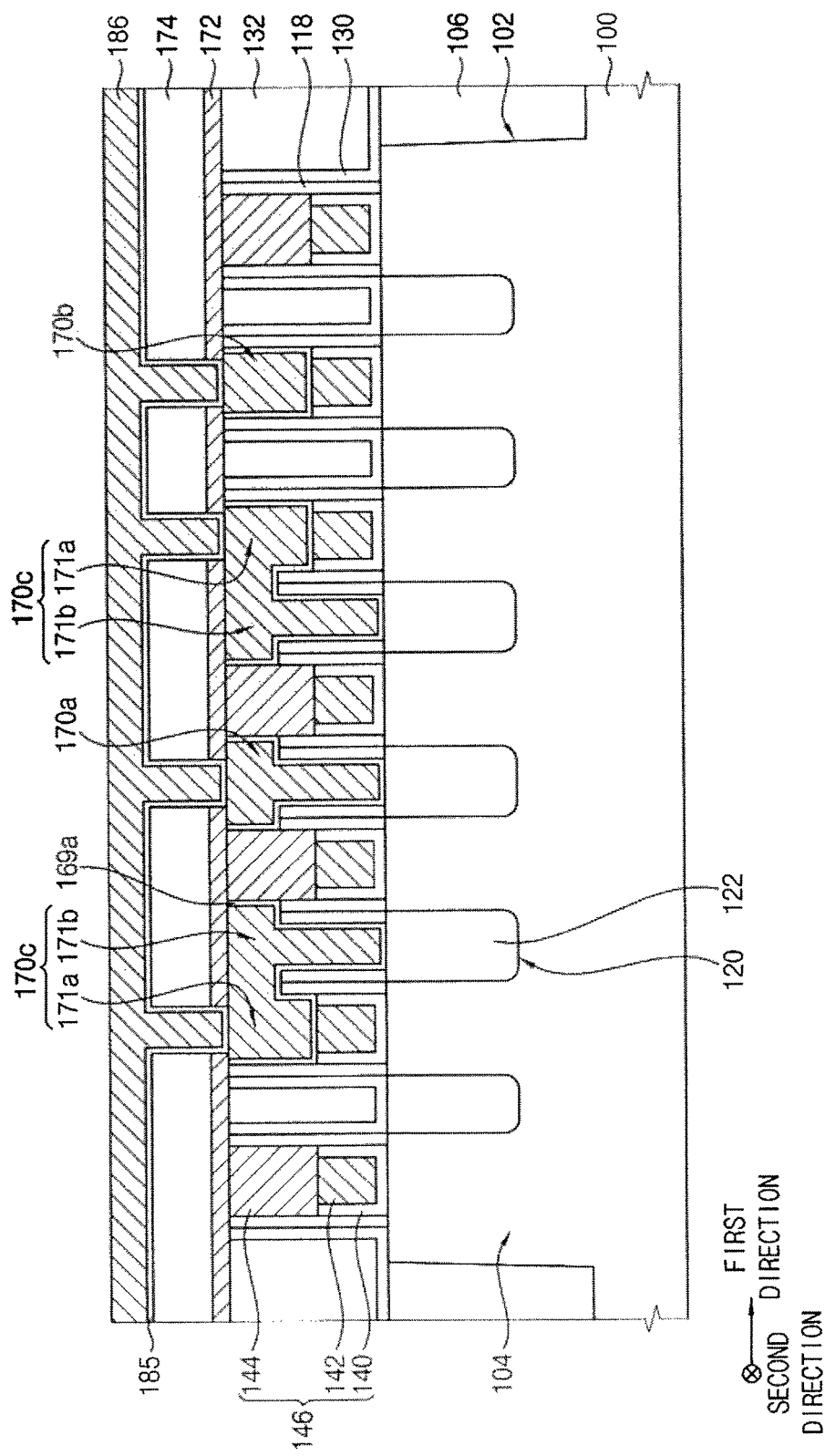

Referring to FIG. 15, a second barrier metal layer 185 may be formed on the second interlayer insulating layer 174 and inner surfaces of the fourth, fifth and sixth contact holes 184a, 184b, and 184c. A second metal layer 186 may be formed on the second barrier metal layer 185 to fill the fourth, fifth and sixth contact holes 184a, 184b, and 184c and extend on the second interlayer insulating layer 174.

The second barrier metal layer 185 may include, for example, titanium, titanium nitride, tantalum, tantalum nitride, or the like. The second metal layer 186 may include, for example, one or more of cobalt, aluminum, copper, tungsten, nickel, platinum, gold, or silver.

Figure 16:
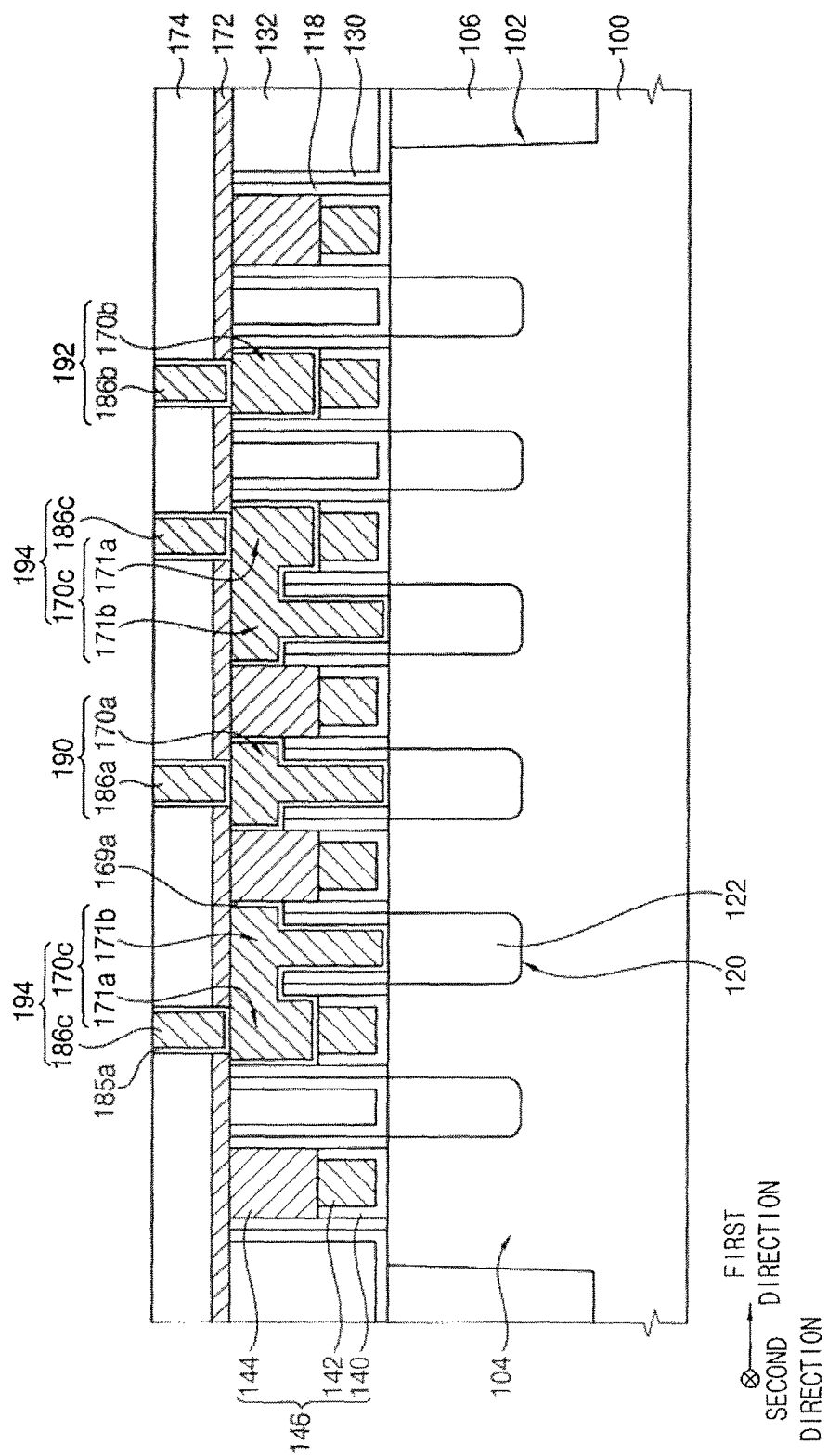

Referring to FIG. 16, the second barrier metal layer 185 and the second metal layer 186 may be planarized to expose an upper surface of the second interlayer insulating layer 174. The planarization process may include a CMP process or an etch-back process. First, second, and third upper contacts 186a, 186b, and 186c may be formed in the fourth, fifth, and sixth contact holes 184a, 184b and 184c, respectively. The first, second, and third upper contacts 186a, 186b, and 186c may each include a stacked structure of a second barrier metal pattern 185a and a second metal pattern.

A width of an upper surface of the first upper contact 186a in the first direction may be less than the width of the upper surface of the first lower contact 170a in the first direction. A width of an upper surface of the second upper contact 186b in the first direction may be less than the width of the upper surface of the second lower contact 170b in the first direction. Additionally, a width of an upper surface of the third upper contact 186c in the first direction may be less than the width of the upper surface of the third lower contact 170c in the first direction.

Figure 17:
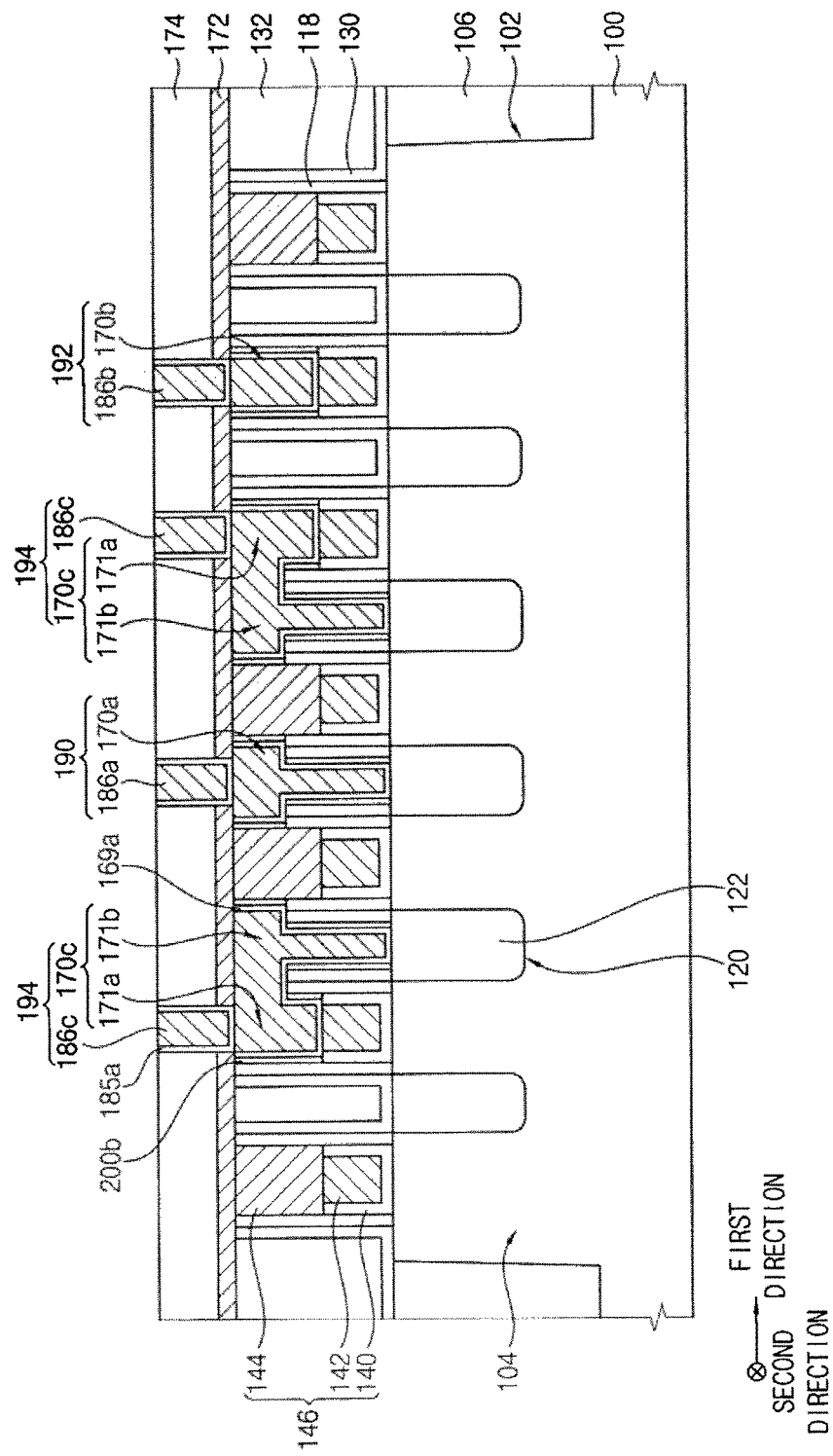
FIG. 17 illustrates a cross-sectional view of a semiconductor device according to example embodiments.

FIG. 17 is a cross-sectional view of a semiconductor device according to example embodiments.

The semiconductor device shown in FIG. 17 may include substantially the same structure as the semiconductor device described with reference to FIG. 1 except for the presence of a second liner 200b on sidewalls of the first, second, and third lower contacts 170a, 170b, and 170c. The first, second, and third lower contacts 170a, 170b, and 170c may be protected by the second liner 200b, and thus a leakage current may be reduced.

FIGS. 18 to 24 are cross-sectional views of stages in a method of manufacturing a semiconductor device according to example embodiments.

Figure 18:
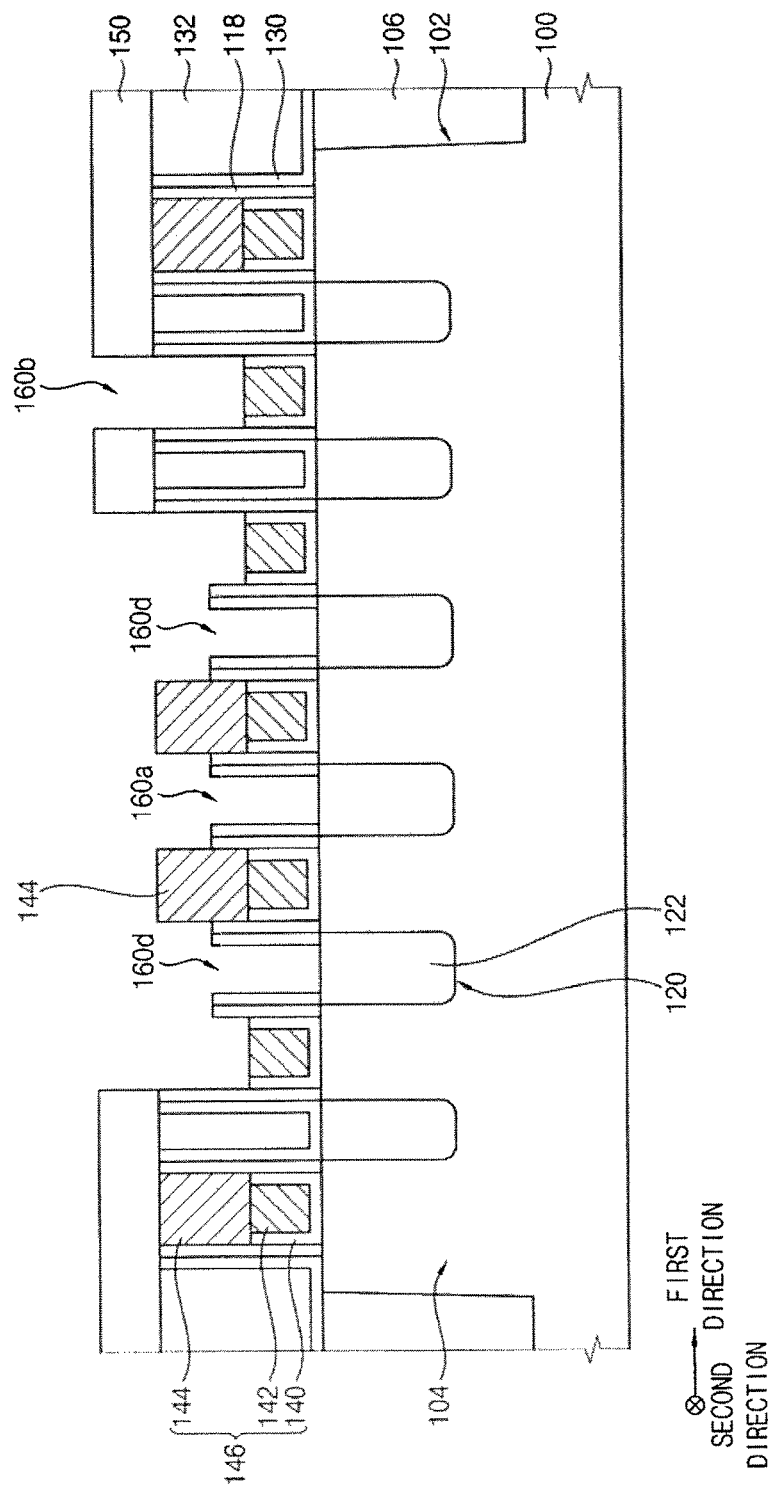
FIGS. 18 to 24 illustrate cross-sectional views of stages in a method of manufacturing a semiconductor device according to example embodiments.

Referring to FIG. 18, the same processes as described with reference to FIGS. 3 to 10 may be performed first. Thereafter, the second sacrificial layer 162 (refer to FIG. 10) may be removed by, for example, the ashing process. Thus, the first, second, and third contact holes 160a, 160b, and 160d may be formed.

Figure 19:
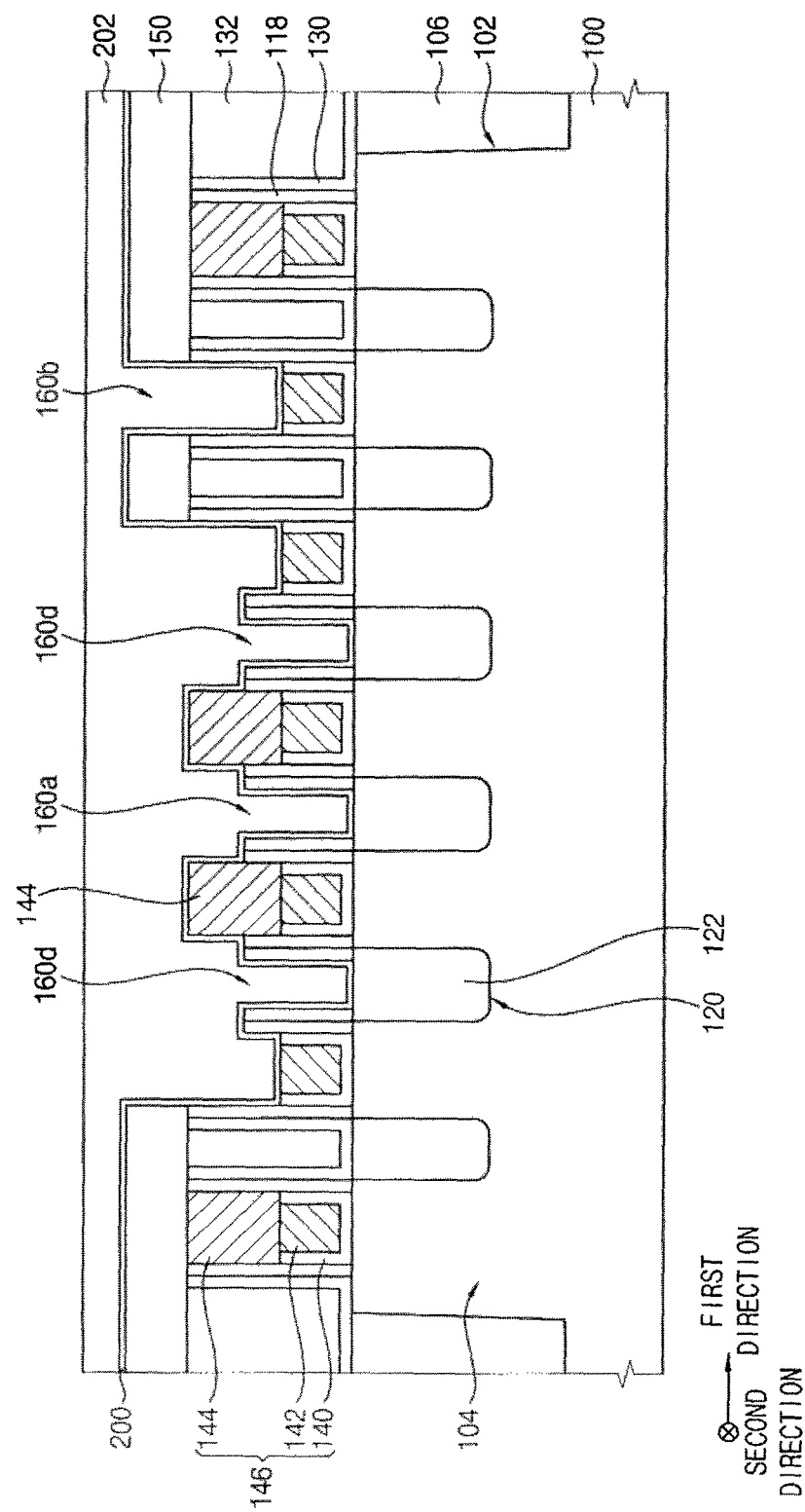

Referring to FIG. 19, a second liner layer 200 may be formed on the sacrificial interlayer insulating layer 150 and inner surfaces of the first, second, and third contact holes 160a, 160b, and 160d. A sacrificial layer 202 may be formed on the second liner layer 200 to sufficiently fill the first, second, and third contact holes 160a, 160b, and 160d.

The second liner layer 200 may include, for example, silicon nitride, silicon carbonitride, aluminum nitride, or the like.

The sacrificial layer 202 may be formed of, for example, a material capable of being easily removed through an ashing process. In some embodiments, the sacrificial layer 202 may include a spin-on hard mask film including amorphous carbon.

Figure 20:
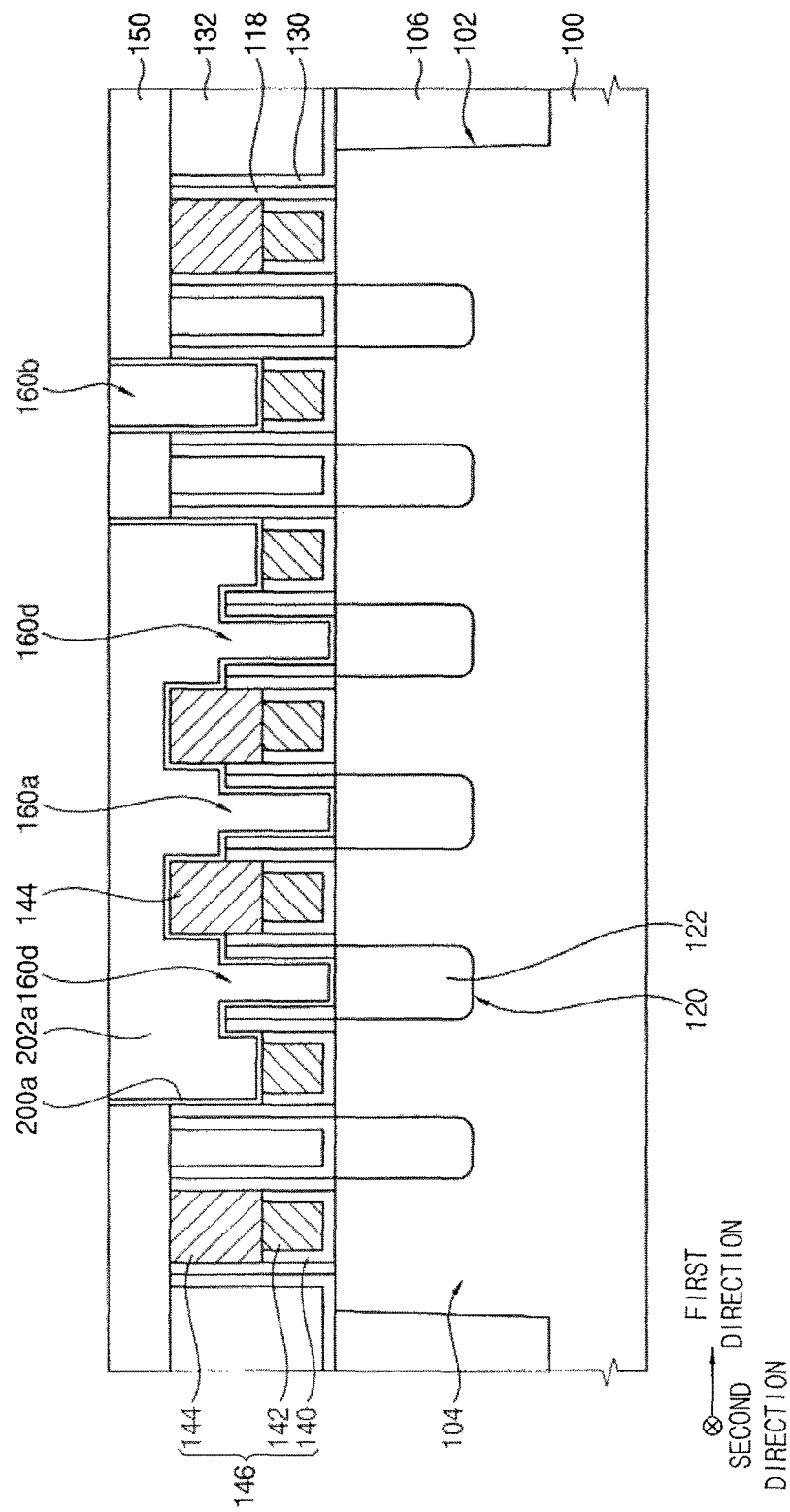

Referring to FIG. 20, the sacrificial layer 202 and the second liner layer 200 may be etched-back to expose an upper surface of the sacrificial interlayer insulating layer 150 such that a preliminary sacrificial pattern 202a and a preliminary second liner 200a may be formed to fill the first, second, and third contact holes 160a, 160b, and 160d.

Figure 21:
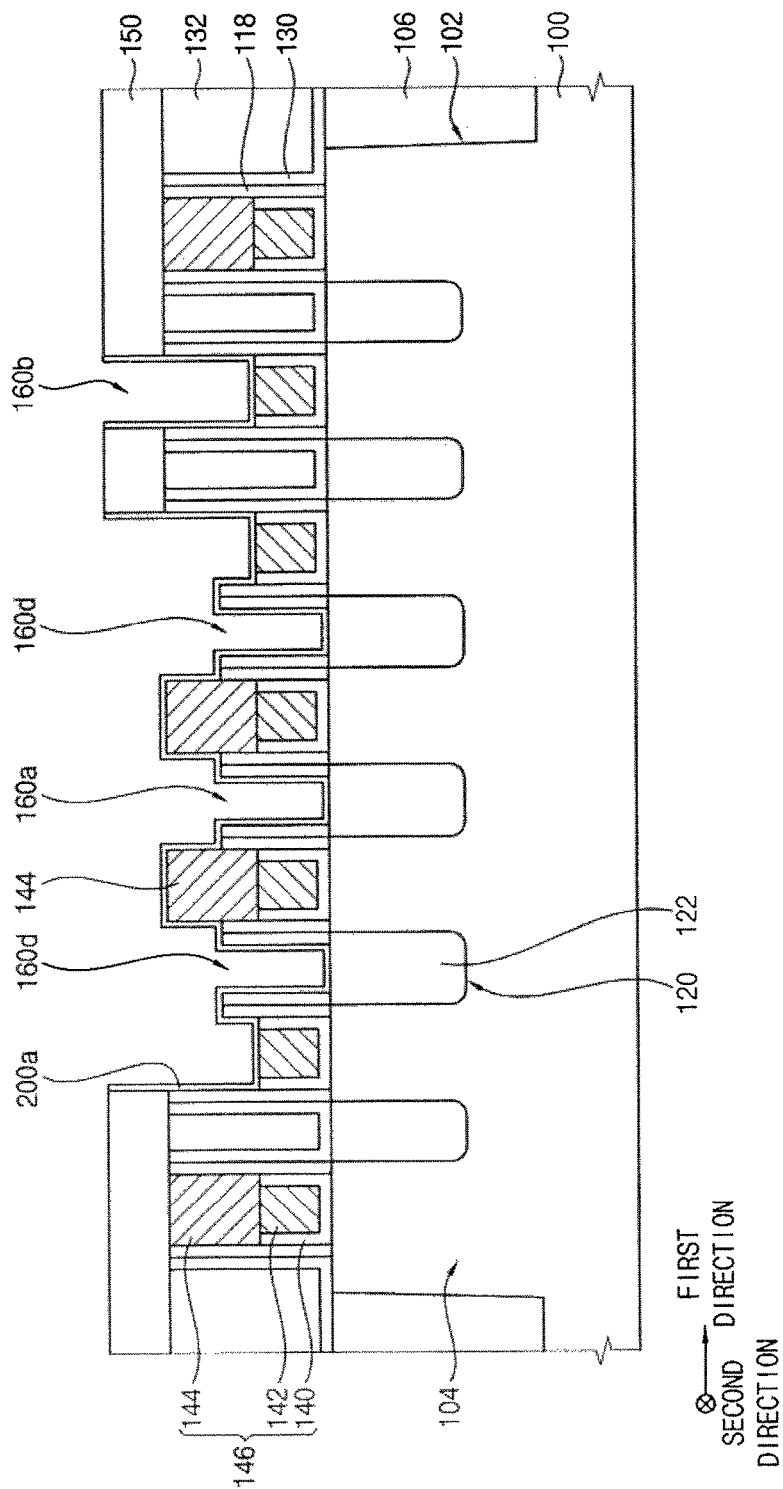

Referring to FIG. 21, the preliminary sacrificial pattern 202a may be removed by, for example, an ashing process. Thus, the preliminary second liner 200a may be exposed.

Figure 22:
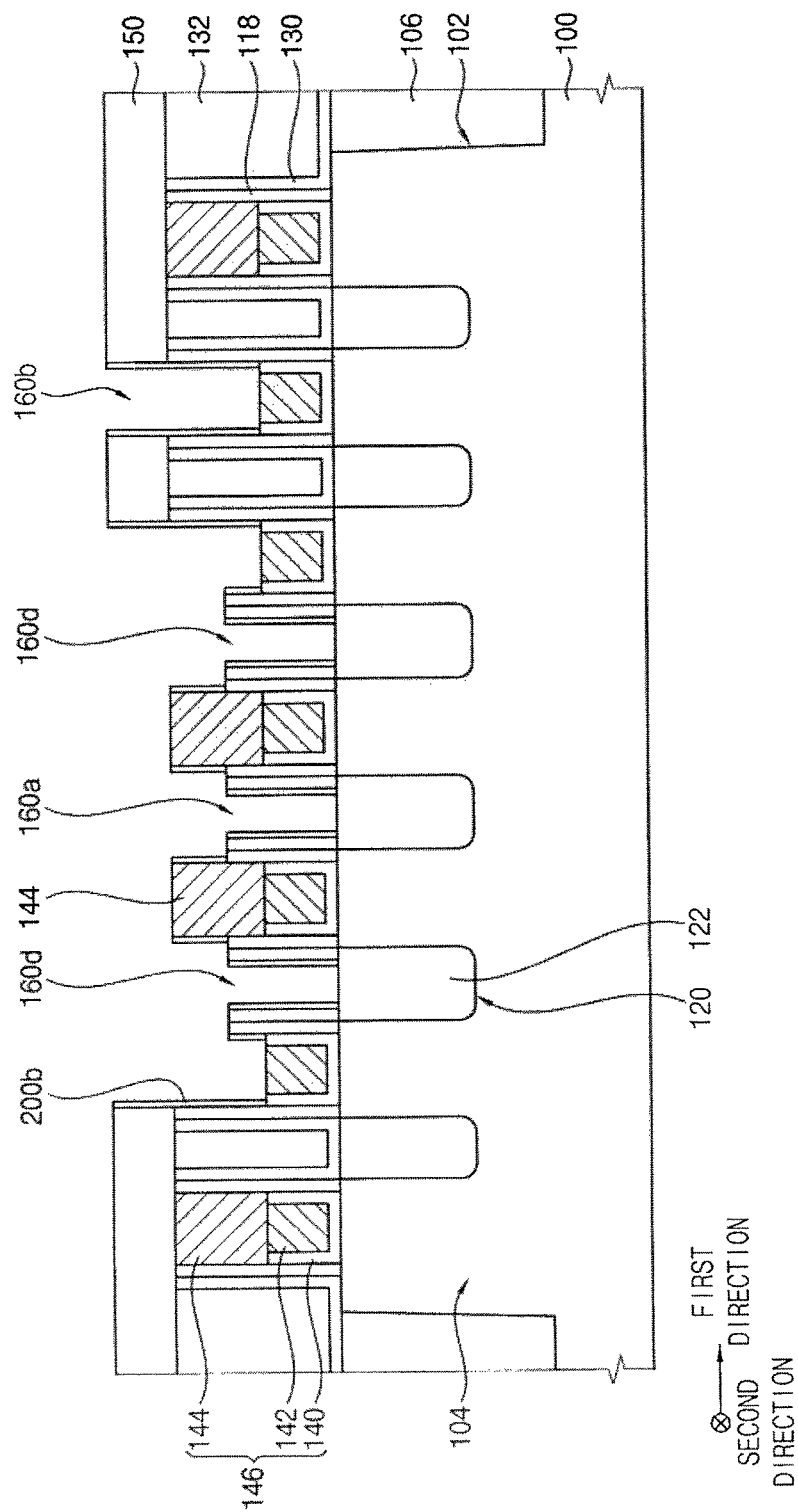

Referring to FIG. 22, the preliminary second liner 200a exposed on bottom surfaces of the first, second, and third contact holes 160a, 160b, and 160d may be selectively removed to form a second liner 200b. For example, the preliminary second liner 200a on the gate electrode 142 and the epitaxial structure 122, respectively, may be selectively removed. Thus, the second liner 200b may be formed on sidewalls of the first, second, and third contact holes 160a, 160b, and 160d. The preliminary second liner 200a may be etched by a dry etching process. The dry etching process may include an anisotropic etching process or isotropic etching process.

The second liner 200b may protect the sidewalls of the first, second, and third contact holes 160a, 160b, and 160d.

Figure 23:
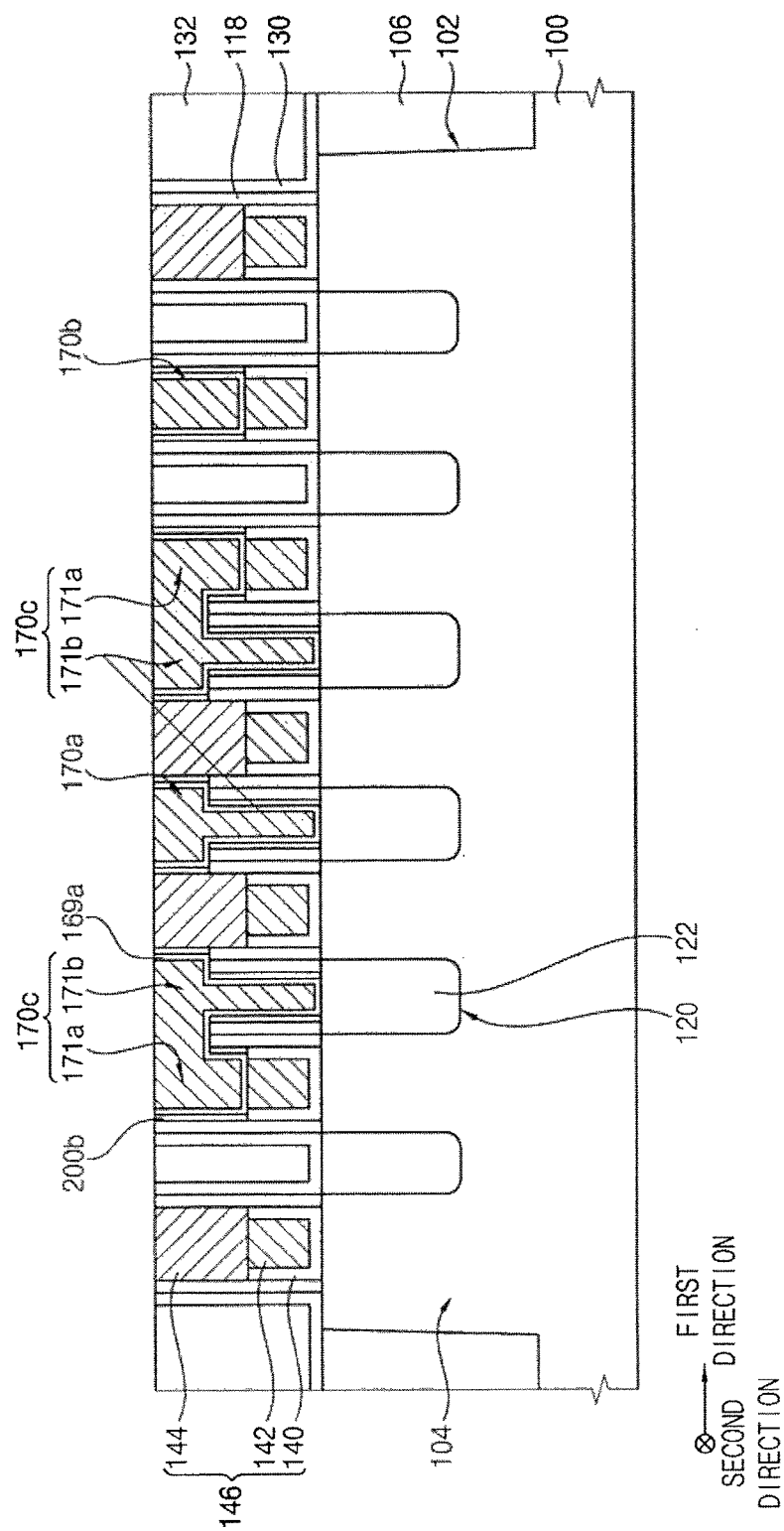

Referring to FIG. 23, on the second liner 200b, the same processes as described with reference to FIGS. 11 and 12 may be performed. Thus, first, second, and third lower contacts 170a, 170b, and 170c may be formed in the first, second, and third contact holes 160a, 160b, and 160d, respectively. The first, second, and third lower contacts 170a, 170b, and 170c may each include a stacked structure of a first barrier metal pattern 169a and a first metal pattern.

Figure 24:
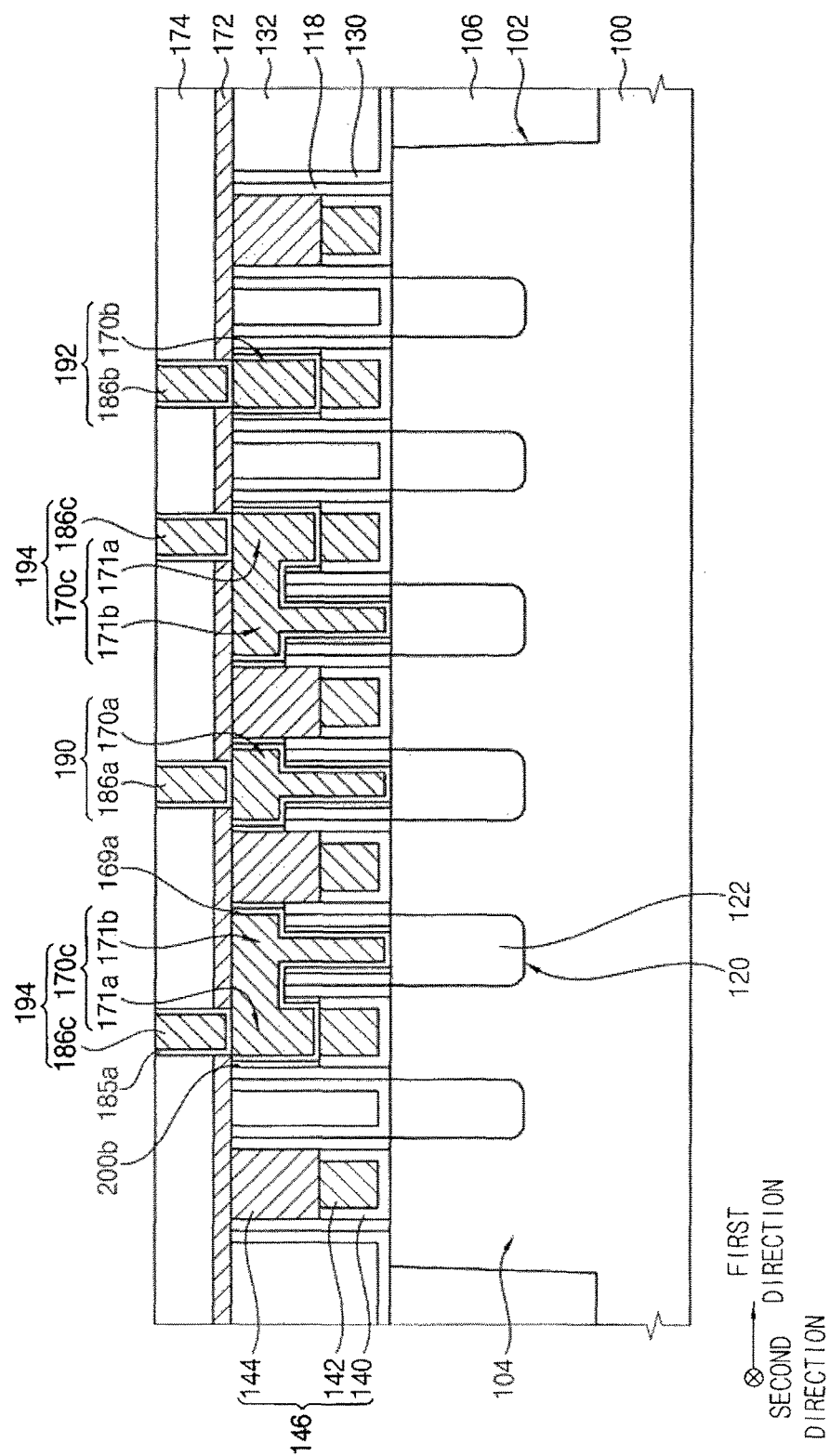

Referring to FIG. 24, the same processes as described with reference to FIGS. 13 and 16 may be performed. Thus, first, second, and third upper contacts 186a, 186b, and 186c may be formed to contact the first, second, and third lower contacts 170a, 170b, and 170c, respectively.

Accordingly, as shown in FIG. 24, a first contact structure 190 including the first lower contact 170a and the first upper contact 186a may be formed. A second contact structure 192 including the second lower contact 170b and the second upper contact 186b may be formed. A third contact structure 194 including the third lower contact 170c and the third upper contact 186c may be formed.

By way of summation and review, fin field effect transistors (FinFETs) are three-dimensional (3D) devices having fins protruding from the substrate. The gate structure may be located over the fins substantially covering the channel region. The portion of the fins not covered by the gate structure may define the source/drain regions of the device.

As described above, embodiments relate to a semiconductor device including contact structures and a method of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
an active fin protruding from the substrate, the active fin extending in a first direction;
gate structures on the active fin, each of the gate structures including a gate insulating layer, a gate electrode, and a capping pattern that are sequentially stacked, and extending in a second direction crossing the first direction;
a first contact structure including a first lower contact and a first upper contact, the first lower contact contacting a surface of a first source/drain in the active fin between the gate structures, the first upper contact contacting an upper surface of the first lower contact;
a second contact structure including a second lower contact and a second upper contact, the second lower contact penetrating the capping pattern of a first one of the gate structures to contact an upper surface of the gate electrode of the first one of the gate structures, the second upper contact contacting an upper surface of the second lower contact; and
a third contact structure including a third lower contact and a third upper contact, the third lower contact penetrating the capping pattern of a second one of the gate structures to contact an upper surface of the gate electrode of the second one of the gate structures, and contacting a surface of a second source/drain in the active fin adjacent to one sidewall of the second one of the gate structures, the third upper contact contacting an upper surface of the third lower contact.

2. The semiconductor device as claimed in claim 1, further comprising a first interlayer insulating layer between the gate structures,
wherein the first, second, and third lower contacts penetrate the first interlayer insulating layer.

3. The semiconductor device as claimed in claim 1, wherein upper surfaces of the first, second, and third lower contacts are substantially coplanar with an upper surface of the capping pattern.

4. The semiconductor device as claimed in claim 1, wherein upper surfaces of the first, second, and third upper contacts are substantially coplanar with one another.

5. The semiconductor device as claimed in claim 1, wherein:
a width of an upper surface of the first upper contact in the first direction is less than a width of the upper surface of the first lower contact in the first direction,
a width of an upper surface of the second upper contact in the first direction is less than a width of the upper surface of the second lower contact in the first direction, and a width of an upper surface of the third upper contact in the first direction is less than a width of the upper surface of the third lower contact in the first direction.

6. The semiconductor device as claimed in claim 1, wherein the first, second, and third lower contacts include a first metal.

7. The semiconductor device as claimed in claim 6, wherein the first metal includes one or more of cobalt, aluminum, copper, tungsten, nickel, platinum, gold, or silver.

8. The semiconductor device as claimed in claim 1, wherein the first, second, and third upper contacts include a second metal.

9. The semiconductor device as claimed in claim 8, wherein the second metal includes one or more of cobalt, aluminum, copper, tungsten, nickel, platinum, gold, or silver.

10. The semiconductor device as claimed in claim 1, wherein:
the first, second, and third lower contacts each include a structure in which a first barrier metal pattern and a first metal pattern are stacked, and
the first, second, and third upper contacts each include a structure in which a second barrier metal pattern and a second metal pattern are stacked.

11. The semiconductor device as claimed in claim 1, further comprising an etch stop layer and a second interlayer insulating layer between the first, second, and third upper contacts.

12. A semiconductor device, comprising:
a substrate;
an active fin protruding from the substrate, the active fin extending in a first direction;
gate structures on the active fin, each of the gate structures including a gate insulating layer, a gate electrode, and a capping pattern that are stacked, and extending in a second direction crossing the first direction;
epitaxial structures in the active fin between the gate structures;
a first contact structure including a first lower contact and a first upper contact, the first lower contact contacting a surface of a first one of the epitaxial structures, the first upper contact contacting an upper surface of the first lower contact;
a second contact structure including a second lower contact and a second upper contact, the second lower contact penetrating the capping pattern of a first one of the gate structures to contact an upper surface of the gate electrode of the first one of the gate structures, the second upper contact contacting an upper surface of the second lower contact; and
a third contact structure including a third lower contact and a third upper contact, the third lower contact penetrating the capping pattern of a second one of the gate structures to contact an upper surface of the gate electrode of the second one of the gate structures, and contacting a surface of a second one of the epitaxial structures adjacent to one sidewall of the second one of the gate structures, the third upper contact contacting an upper surface of the third lower contact.

13. The semiconductor device as claimed in claim 12, wherein:
a width of an upper surface of the first upper contact in the first direction is less than a width of the upper surface of the first lower contact in the first direction,
a width of an upper surface of the second upper contact in the first direction is less than a width of the upper surface of the second lower contact in the first direction, and
a width of an upper surface of the third upper contact in the first direction is less than a width of the upper surface of the third lower contact in the first direction.

14. The semiconductor device as claimed in claim 12, wherein the first, second, and third lower contacts include a first metal.

15. The semiconductor device as claimed in claim 12, wherein the first, second, and third upper contacts include a second metal.

16. A semiconductor device, comprising:
a substrate having an active region in a shape of a fin that extends in a first direction, the fin having a plurality of source/drain regions spaced apart therein;
gate structures crossing the fin in regions between the source/drain regions, each of the gate structures including a gate electrode;
a first contact structure in electrical contact with a first one of the plurality of source/drain regions, the first contact structure including a first lower contact and a first upper contact directly on the first lower contact;
a second contact structure in electrical contact with a gate electrode of a first one of the gate structures, the second contact structure including a second lower contact and a second upper contact directly on the second lower contact; and
a third contact structure in electrical contact with a gate electrode of a second one of the gate structures and in electrical contact with a second one of the plurality of source/drain regions, the third contact structure including a third lower contact and a third upper contact directly on the third lower contact.

17. The semiconductor device as claimed in claim 16, wherein:
a width of an upper surface of the first upper contact in the first direction is less than a width of the upper surface of the first lower contact in the first direction,
a width of an upper surface of the second upper contact in the first direction is less than a width of the upper surface of the second lower contact in the first direction, and
a width of an upper surface of the third upper contact in the first direction is less than a width of the upper surface of the third lower contact in the first direction.

18. The semiconductor device as claimed in claim 17, wherein upper surfaces of the first upper contact and the second upper contact are separated by a greater distance in the first direction than upper surfaces of the first lower contact and the second lower contact.

19. The semiconductor device as claimed in claim 16, wherein the source/drain regions are epitaxial regions in recesses in the fin.

20. The semiconductor device as claimed in claim 16, wherein at least one of the first, second, and third contact structures includes a barrier metal pattern interposed between the respective upper and lower contacts, the barrier metal pattern being a different material from at least one of the respective upper and lower contacts.

* * * * *